US006723174B2

(12) United States Patent
Nelson et al.

(10) Patent No.: US 6,723,174 B2
(45) Date of Patent: Apr. 20, 2004

(54) AUTOMATED SEMICONDUCTOR PROCESSING SYSTEM

(75) Inventors: Gordon Ray Nelson, Kalispell, MT (US); Daniel P. Bexten, Kalispell, MT (US); Jeffry A. Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/163,837

(22) Filed: Jun. 5, 2002

(65) Prior Publication Data

US 2002/0150449 A1 Oct. 17, 2002

Related U.S. Application Data

(60) Division of application No. 09/612,009, filed on Jul. 7, 2000, which is a continuation-in-part of application No. 09/274,511, filed on Mar. 23, 1999, now Pat. No. 6,279,724, which is a continuation-in-part of application No. 09/112,259, filed on Jul. 8, 1998, now Pat. No. 6,273,110, which is a continuation-in-part of application No. 08/994,737, filed on Dec. 19, 1997, now Pat. No. 6,447,232, which is a continuation-in-part of application No. 08/622,349, filed on Mar. 26, 1996, now Pat. No. 5,784,797.

(51) Int. Cl.[7] ................................................. B08B 3/02
(52) U.S. Cl. ..................... 134/33; 414/811; 414/937
(58) Field of Search ................. 414/937, 936, 414/939, 940, 811; 134/33

(56) References Cited

U.S. PATENT DOCUMENTS

| 4,040,533 A | 8/1977 | DeBoer |
| 4,449,885 A | 5/1984 | Hertel et al. |
| 4,466,530 A | 8/1984 | Stuckler |
| 4,506,777 A | 3/1985 | Kampf |
| 4,568,234 A | 2/1986 | Lee et al. |
| 4,643,629 A | 2/1987 | Takahashi et al. |
| 4,682,614 A | * 7/1987 | Silvernail et al. ............. 134/99 |
| 4,701,096 A | * 10/1987 | Fisher ........................ 414/416 |

(List continued on next page.)

FOREIGN PATENT DOCUMENTS

| EP | 047132 | 3/1982 |
| EP | 0 047 132 A2 | 3/1982 |
| EP | 0 452 939 A1 | 10/1991 |
| EP | 560 439 | 9/1993 |
| EP | 0 560 439 B1 | 9/1993 |
| JP | 59-114206 | 7/1984 |
| JP | 63-219134 | 9/1988 |
| JP | 5-146984 A | 6/1993 |
| TW | 15883 | 5/1991 |
| WO | WO A 81/02533 | 9/1981 |

OTHER PUBLICATIONS

Brochure—Magnum—The perfect partnership of process excellence and production control in fully automated platform, Semitool, 1996, 12 pages.
Brochure—"Centurium—500/6000 Series Automated Process Systems for large Substrate Wet Processing" Semitool, Jun. 1996, 3 pages.
Brochure—Centurim—Process cluster Semitool, Sep. 13, 1995, 16 pages.
Brochure—"Centrium"—Fully Automated Large Substrate Wet Processing System Semitool, 6/96, 5 pages.

*Primary Examiner*—Thomas J. Brahan
(74) *Attorney, Agent, or Firm*—Perkins Coie LLP

(57) ABSTRACT

An automated semiconductor processing system has an indexer bay perpendicularly aligned with a process bay within a clean air enclosure. An indexer in the indexer bay provides stocking or storage for work in progress semiconductor wafers. Process chambers are located in the process bay. A process robot moves between the indexer bay and process bay to carry semi-conductor wafers to and from the process chambers. The process robot has a robot arm vertically moveable along a lift rail. Semiconductor wafers are carried offset from the robot arm, to better avoid contamination. The automated system is compact and requires less clean room floor space.

14 Claims, 37 Drawing Sheets

U.S. PATENT DOCUMENTS

| | | |
|---|---|---|
| 4,744,715 A | 5/1988 | Kawabata |
| 4,824,309 A | 4/1989 | Kakehi |
| 4,886,412 A | 12/1989 | Wooding et al. |
| 4,924,890 A | 5/1990 | Giles |
| 4,981,408 A | 1/1991 | Hughes et al. |
| 5,048,164 A | 9/1991 | Harima |
| 5,055,036 A | 10/1991 | Asano et al. |
| 5,064,337 A | 11/1991 | Asakawa et al. |
| 5,090,555 A | 2/1992 | Kura |
| 5,110,248 A | 5/1992 | Asano et al. |
| 5,125,784 A | 6/1992 | Asano |
| 5,131,799 A | 7/1992 | Nishi et al. |
| 5,178,639 A | 1/1993 | Nishi |
| 5,180,273 A | 1/1993 | Sakaya et al. |
| 5,181,819 A | 1/1993 | Sakata et al. |
| 5,203,445 A | 4/1993 | Shiraiwa |
| 5,215,420 A | 6/1993 | Hughes et al. |
| 5,232,328 A | 8/1993 | Owczarz |
| 5,301,700 A | 4/1994 | Kamikawa et al. |
| 5,339,539 A | 8/1994 | Shiraishi et al. |
| 5,364,219 A | 11/1994 | Takahashi |
| 5,378,145 A | 1/1995 | Ono |
| 5,451,131 A | 9/1995 | Hecht et al. |
| 5,462,397 A | 10/1995 | Iwabuchi |
| 5,468,112 A | 11/1995 | Ishii et al. |
| 5,544,421 A | 8/1996 | Thompson |
| 5,553,988 A | 9/1996 | Horn et al. |
| 5,562,383 A | 10/1996 | Iwai et al. |
| 5,603,777 A * | 2/1997 | Ohashi ............... 134/25.4 |
| 5,613,821 A | 3/1997 | Muka et al. |
| 5,620,295 A | 4/1997 | Nishi |
| 5,660,517 A | 8/1997 | Thompson et al. |
| 5,664,337 A | 9/1997 | Davis et al. |
| 5,674,039 A | 10/1997 | Walker et al. |
| 5,674,123 A | 10/1997 | Roberson, Jr. et al. |
| 5,678,320 A | 10/1997 | Thompson et al. |
| 5,731,678 A | 3/1998 | Zila et al. |
| 5,740,059 A * | 4/1998 | Hirata et al. ......... 364/478.01 |
| 5,755,332 A | 5/1998 | Holliday et al. |
| 5,762,745 A | 6/1998 | Hirose |
| 5,772,386 A | 6/1998 | Mages et al. |
| 5,784,797 A | 7/1998 | Curtis et al. |
| 5,784,802 A | 7/1998 | Thompson |
| 5,788,448 A | 8/1998 | Wakamori et al. |
| 5,836,736 A | 11/1998 | Thompson |
| 5,885,045 A | 3/1999 | Rush |
| 5,944,475 A | 8/1999 | Bonora et al. |
| 5,947,675 A | 9/1999 | Matsushima |
| 6,009,890 A | 1/2000 | Kaneko et al. |
| 6,030,208 A | 2/2000 | Williams et al. |

* cited by examiner

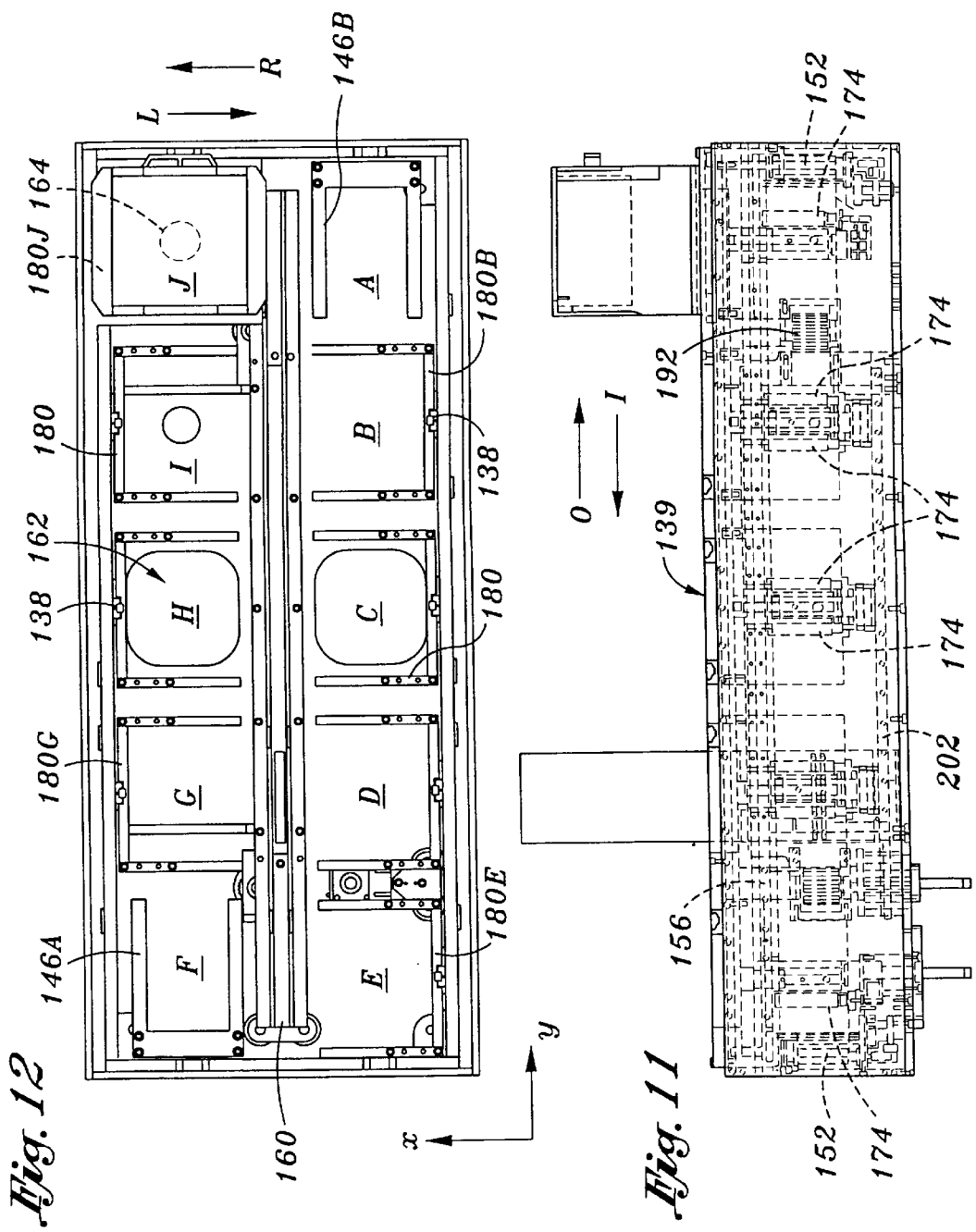

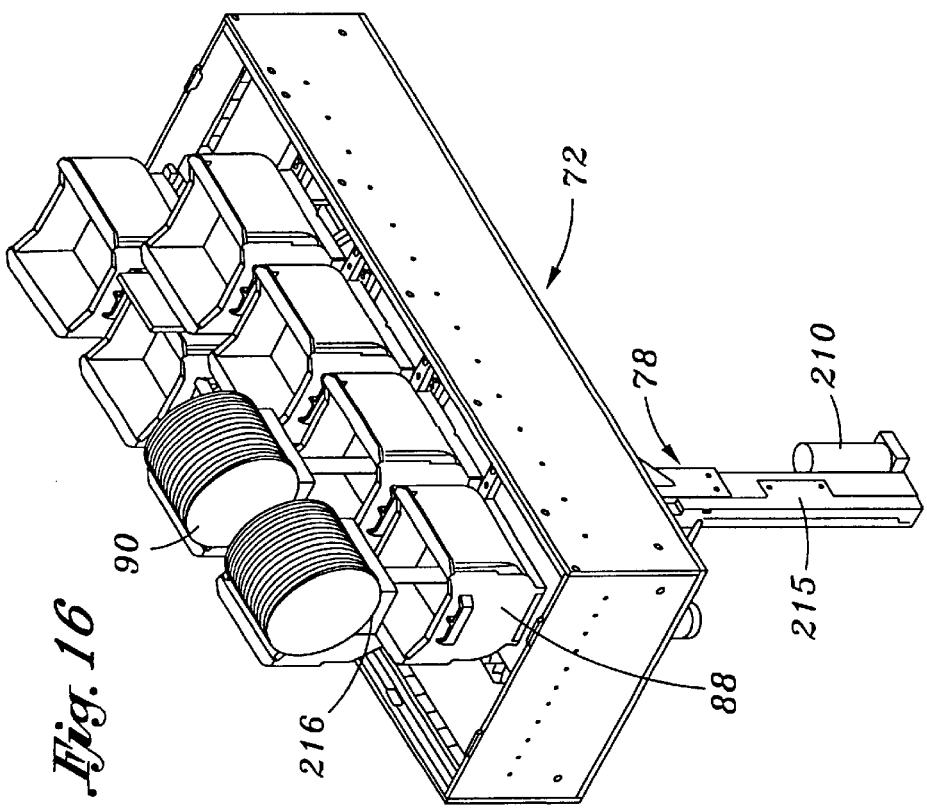
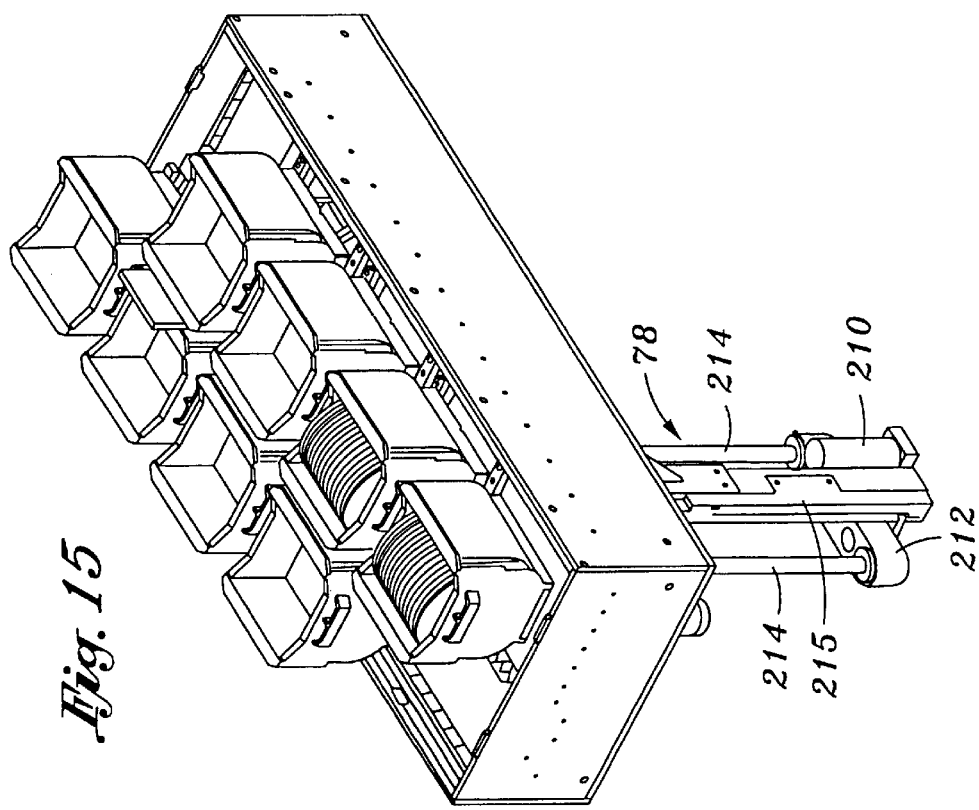

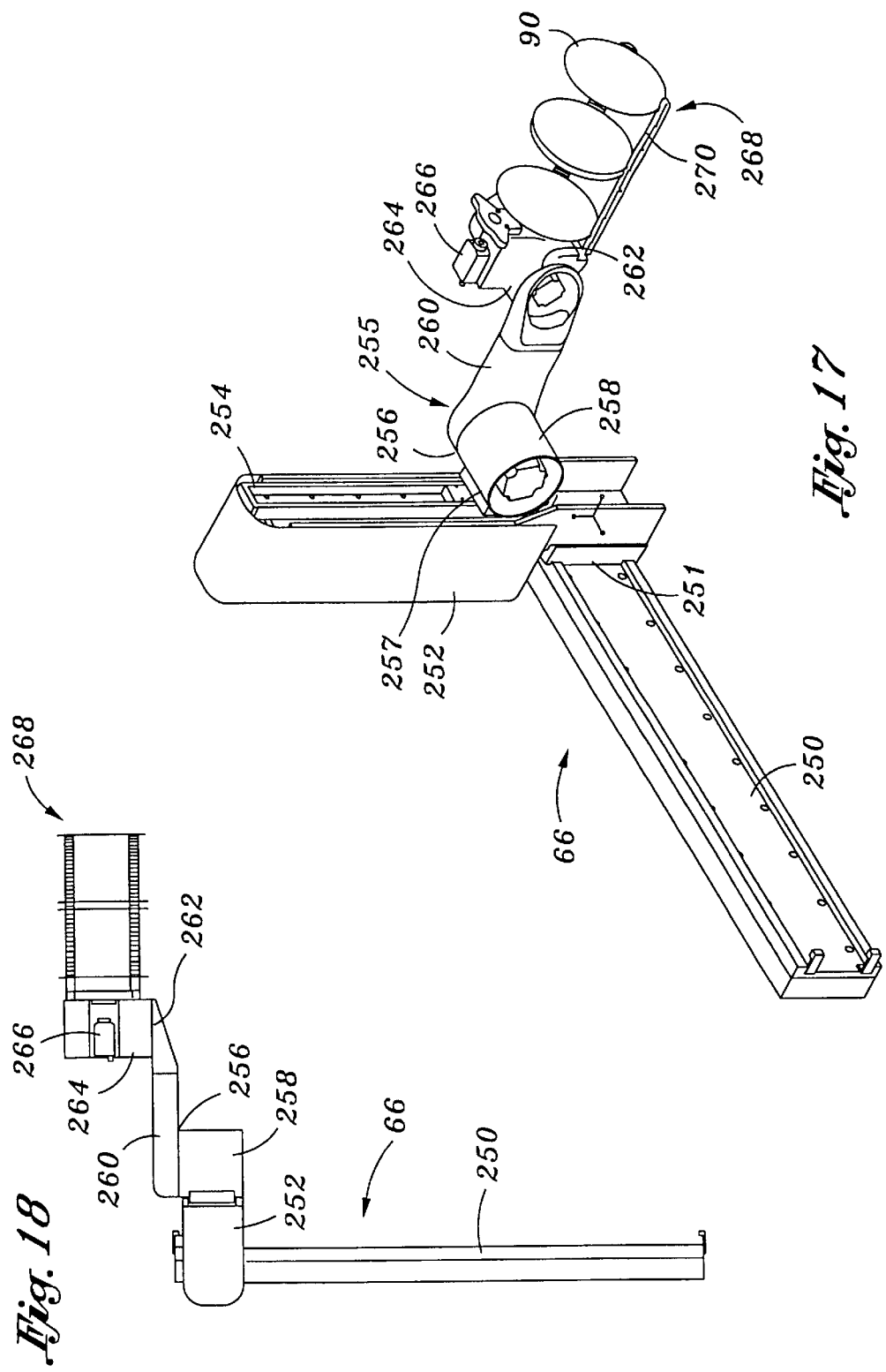

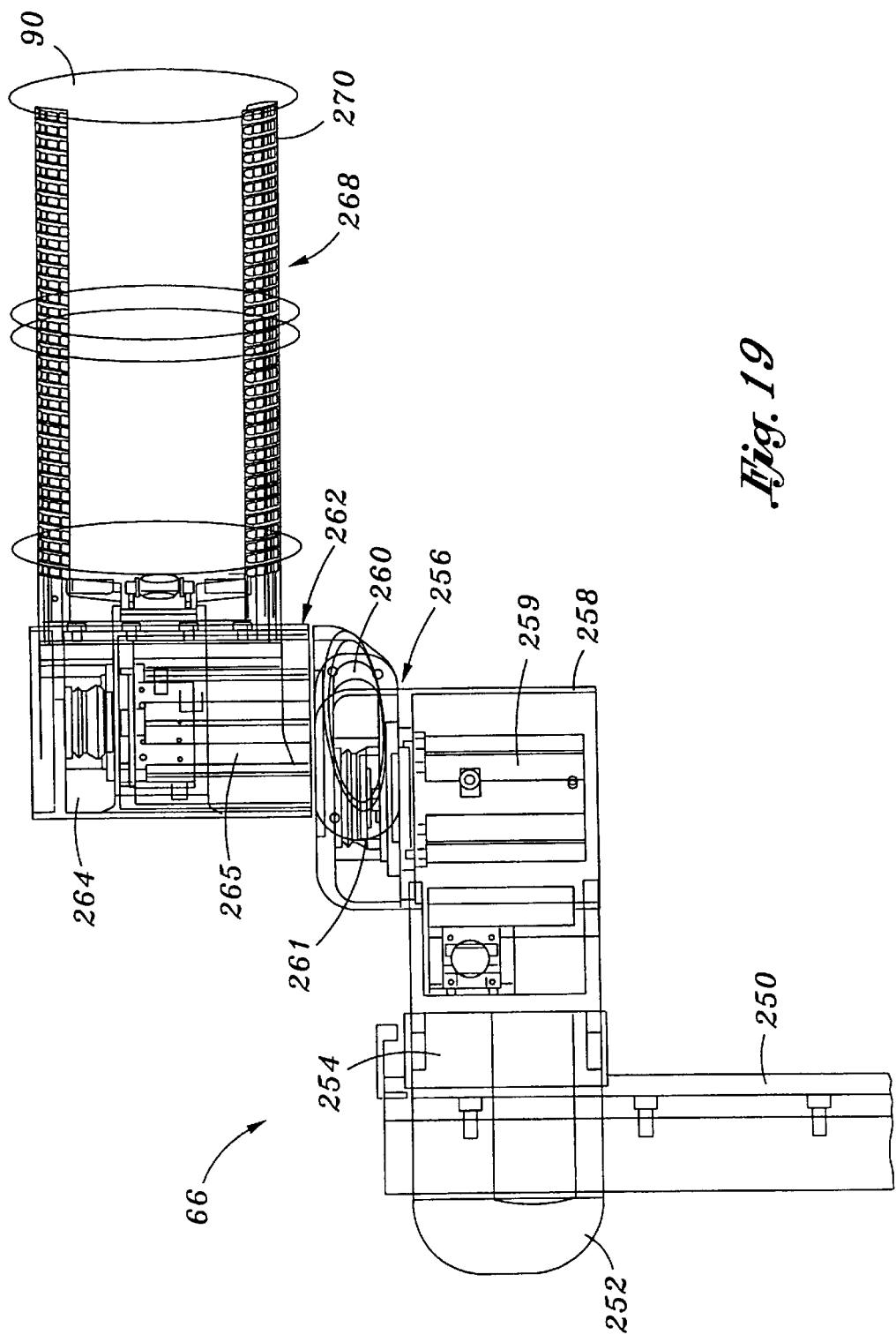

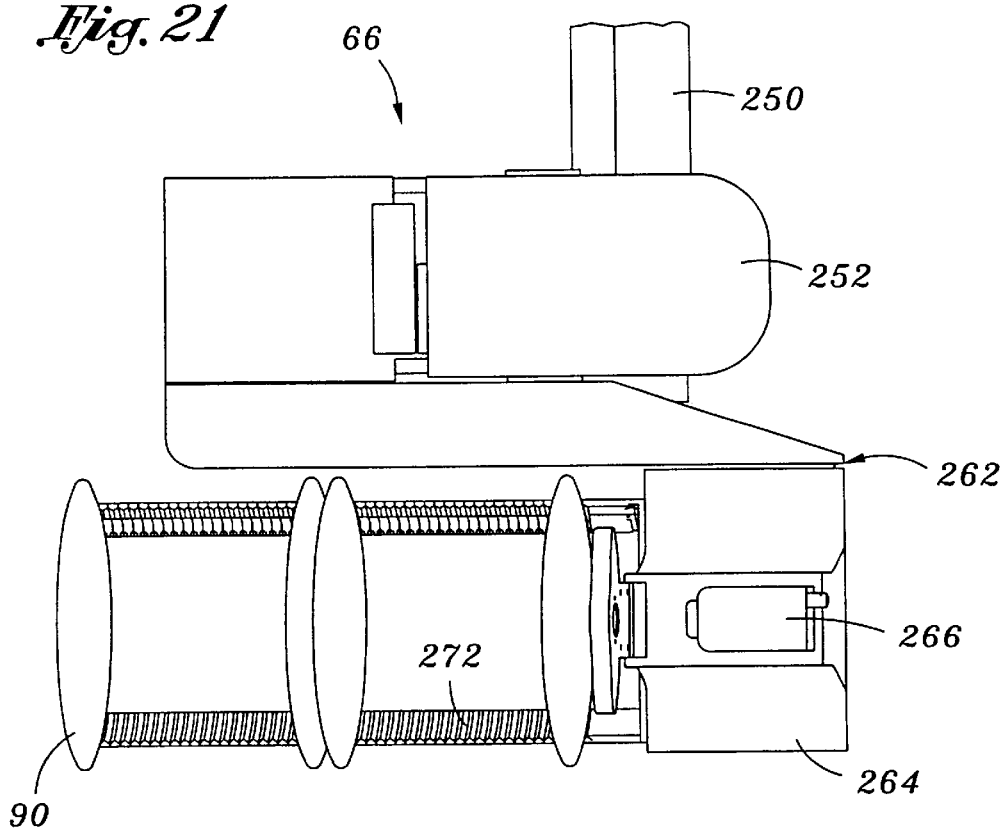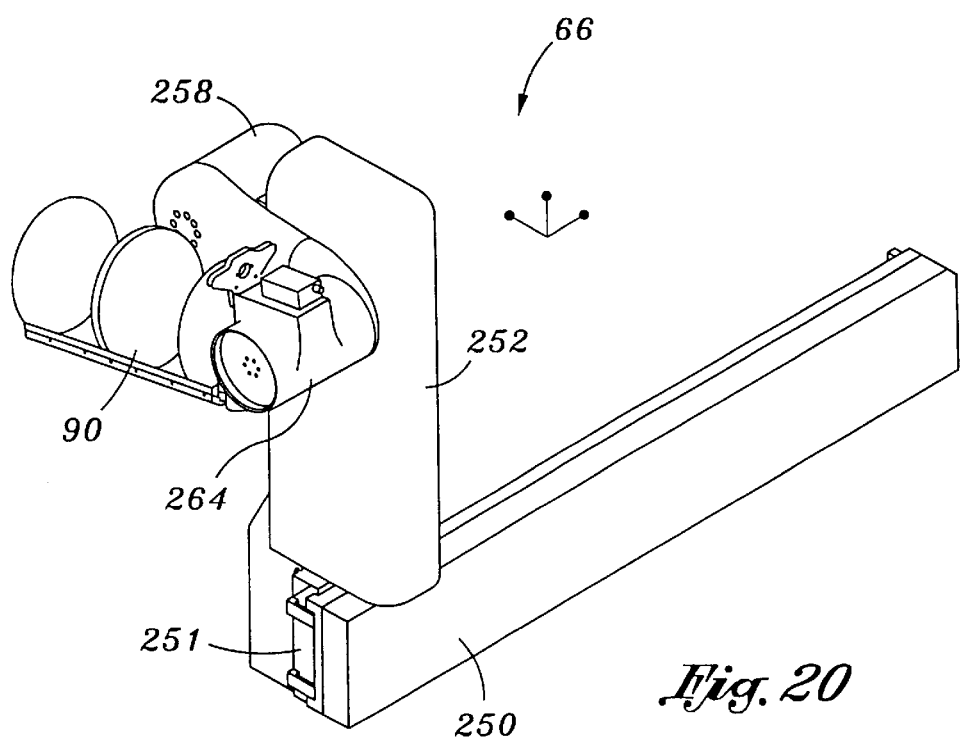

AUTOMATED SEMICONDUCTOR PROCESSING SYSTEM

This application is a Division of U.S. patent application Ser. No. 09/612,009, filed Jul. 7, 2000, and now pending, which is a Continuation-in-Part of U.S. patent application Ser. No. 09/274,511, filed Mar. 23, 1999 now U.S. Pat. No. 6,279,724, which is a Continuation-in-Part of U.S. patent application Ser. No. 09/112,259, filed Jul. 8, 1998, now U.S. Pat. No. 6,273,110, which is a Continuation-in-Part of U.S. patent application Ser. No. 08/994,737, filed Dec. 19, 1997 and now U.S. Pat. No. 6,447,232, which is a Continuation-in-Part of U.S. patent application Ser. No. 08/622,349 filed May 5, 1997 and now abandoned, which is a Continuation-in-Part of U.S. patent application Ser. No. 08/622,349, filed Mar. 26, 1996, and now U.S. Pat. No. 5,784,797. Priority to these applications is claimed under 35 U.S.C. §120, and these applications are incorporated herein by reference. U.S. Pat. No. 6,439,824 is also incorporated herein by reference.

The field of the invention is automated semiconducted wafer processing systems, used for processing semiconductor wafers, hard disk media, semiconductor substrates, optical materials, and similar materials requiring very low levels of contamination, collectively referred to here as "wafers".

BACKGROUND OF THE INVENTION

Computers, televisions, telephones and other electronic products contain large numbers of essential electronic semiconductor devices. To produce electronic products, hundreds or thousands of semiconductor devices are manufactured in a very small space, using lithography techniques on semiconductor substrates, such as on silicon wafers. Due to the extremely small dimensions involved in manufacturing semiconductor devices, contaminants on the semiconductor substrate material, such as particles of dust, dirt, paint, metal, etc. lead to defects in the end products.

To exclude contaminants, semiconductor substrates are processed within clean rooms. Clean rooms are enclosed areas or rooms within a semiconductor manufacturing facility, designed to keep out contaminants. All air provided to a clean room is typically highly filtered to prevent airborne contaminants from entering into or circulating within the clean room. Special materials and equipment are needed to maintain contaminants within the clean room at adequately low levels. Consequently, construction and maintenance of clean rooms can be time consuming and costly. As a result, the semiconductor processing equipment installed within a clean room should preferably be compact, so that large numbers of semiconductor wafers can be processed within a smaller space, thereby reducing space requirements and costs. Accordingly, there is a need for smaller semiconductor processing equipment, to reduce clean room space requirements.

Existing automated semiconductor processing systems use robots to carry the semiconductor materials. These robots are designed to avoid creating particles which could contaminate the semiconductors. However, even with careful design, material selection, and robot operation, particles may still be created by these robots, via their moving parts. Accordingly, there is a need for improved techniques for processing semiconductor substrate materials with very low levels of contamination to maintain the level of defects at acceptable levels.

SUMMARY OF THE INVENTION

In a first aspect of the invention, an automated semiconductor processing system has an indexer bay or space and a process bay or space within an enclosure. The indexer bay is oriented perpendicularly to the process bay, to form a compact design requiring less floor space in a clean room.

In a second separate aspect of the invention, an indexer is provided in the indexer bay. The indexer preferably holds pallets for supporting semiconductor wafers contained within cassettes. Pallet movers in the indexer move the pallets and cassettes in sequence from an indexer loading position, through a plurality of intermediate storage positions, to an indexer unload position. The indexer allows the automated semiconductor processing system to run continuously, by moving and storing cassettes.

In a third separate aspect of the invention, the pallet movers include an x-axis and y-axis shift system, for moving pallets longitudinally and laterally around in the indexer. Preferably the y-axis shift system has a pair of toothed belts engaging a rack on the bottom of the pallets, to prevent inadvertent movement of the pallets relative to the belts.

In a fourth separate aspect of the invention, prisms on the pallets redirect light beams from sensor pairs, to detect the presence or absence of a cassette on a pallet, or wafers in a cassette.

In a fifth separate aspect of the invention, a process robot within an automated semiconductor processing system has a robot arm vertically moveable along a lift rail. The robot arm has a forearm segment extending between an elbow joint and a wrist joint. A wafer holder on the robot arm is laterally offset from the elbow and wrist joints. The robot arm is compact yet has an extended range of travel. The processing system therefore requires less space.

In a sixth and separate aspect of the invention, a moveable buffer shelf is positioned over the indexer, to increase productivity and versatility of the system.

In a seventh and separate aspect of the invention, a novel process module door is provided to better close and seal a process module chamber.

In a eighth and separate aspect of the invention, an indexer or work-in-progress space is positioned under a docking station and transfer station, to provide a compact processing system.

In a ninth aspect of the invention, two or more of the features described above are combined to provide an improved automated semiconductor processing system.

It is an object of the invention to provide an automated semiconductor processing system, better designed to keep semiconductor wafers free of contaminants. It is a further object of the invention to provide an automated semiconductor processing system that is versatile, yet compact, to reduce clean room space requirements.

Other objects, features and advantages will appear hereinafter. The various features described among the embodiments may of course be used individually or in differing combinations. The invention resides not only in the systems described, but also in the subcombinations and subsystems described.

BRIEF DESCRIPTION OF THE DRAWINGS

In the drawings, wherein the same reference number denotes the same element throughout the several views:

FIG. 11 is a leftside view of the indexer shown in FIGS. 1–3.

FIG. 12 is a plan view thereof, with the pallets on the indexer removed, for clarity of illustration.

FIG. 15 is a perspective view of the elevator shown in FIG. 5, in the lowered position.

FIG. 16 is a perspective view thereof showing the elevator in the raised position.

FIG. 17 is a front perspective view of the process robot shown in FIGS. 2 and 5.

FIG. 18 is a plan view thereof.

FIG. 19 is an enlarged plan view thereof.

FIG. 20 is a rear perspective view of the process robot, with the arm fully withdrawn.

FIG. 21 is a plan view thereof.

DETAILED OF DESCRIPTION OF THE DRAWINGS

OVERVIEW

Figure 1:
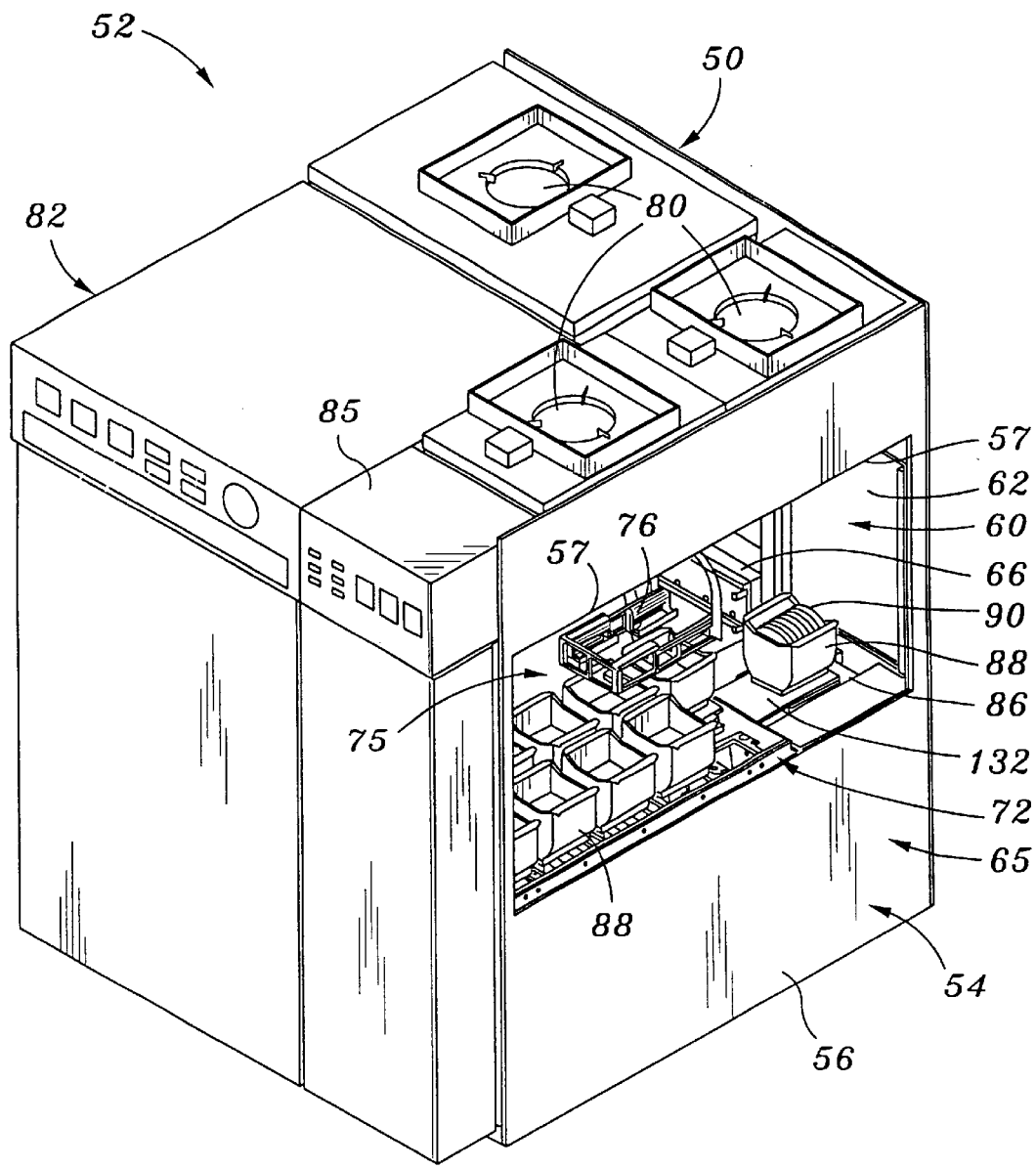
FIG. 1 is a top, rear and left side perspective view of the present automated semiconductor processing system.
Figure 2:
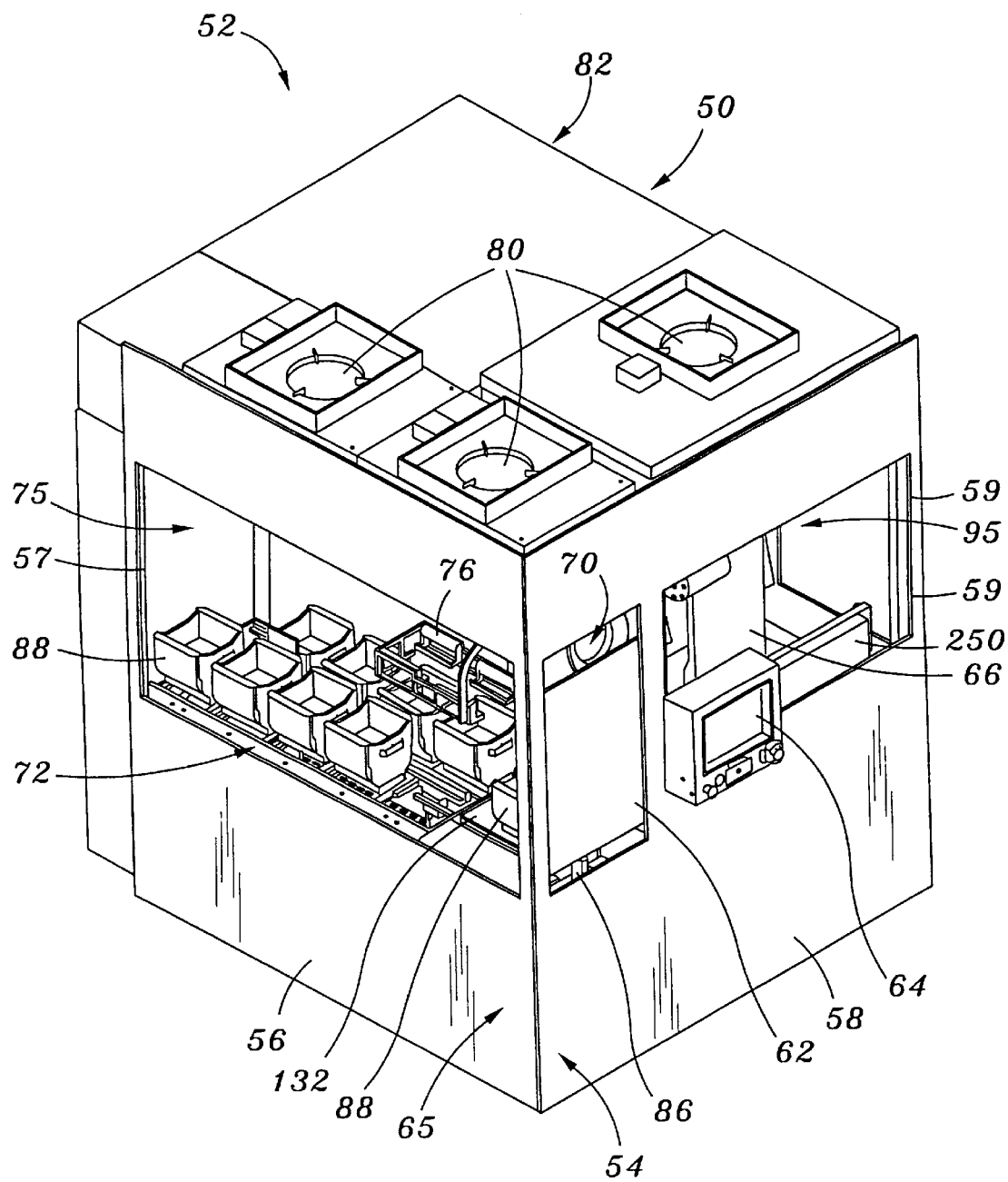
FIGS. 2 and 3 are front, top, and left side perspective views thereof.

Turning now in detail to the drawings, as shown in FIGS. 1–5, an automated semiconductor material processing system 50 is installed within a clean room 52. The system 50 has a clean air enclosure or housing 54 having a left side wall 56 with a fixed transparent window 57 to allow viewing of operations within the enclosure 54. Similarly, the enclosure 54 has a front wall 58, as shown in FIG. 2, having a fixed transparent window 59.

A loading/unloading opening 60 in the front wall 58 is closed off during operation of the system 50 by a transparent loading window or panel 62, as illustrated in FIG. 2. Referring to FIGS. 1–5, down draft fans or blowers 80 are provided on top of the enclosure 54, to continuously move clean air room downwardly through the enclosure. A utilities compartment 82 provides space for power supplies, reagent tanks, pumps, and other components well known for semiconductor processing.

A user interface 64, on the front wall 58 provides information and inputs control instructions from the system operator. The user interface is linked to a computer/controller 85, in the utilities compartment 82, or at a remote location. The computer/controller 85 is linked to the various motors and sensors described below, as well as to a facility control computer, to control operation of the system 50.

Figure 3:
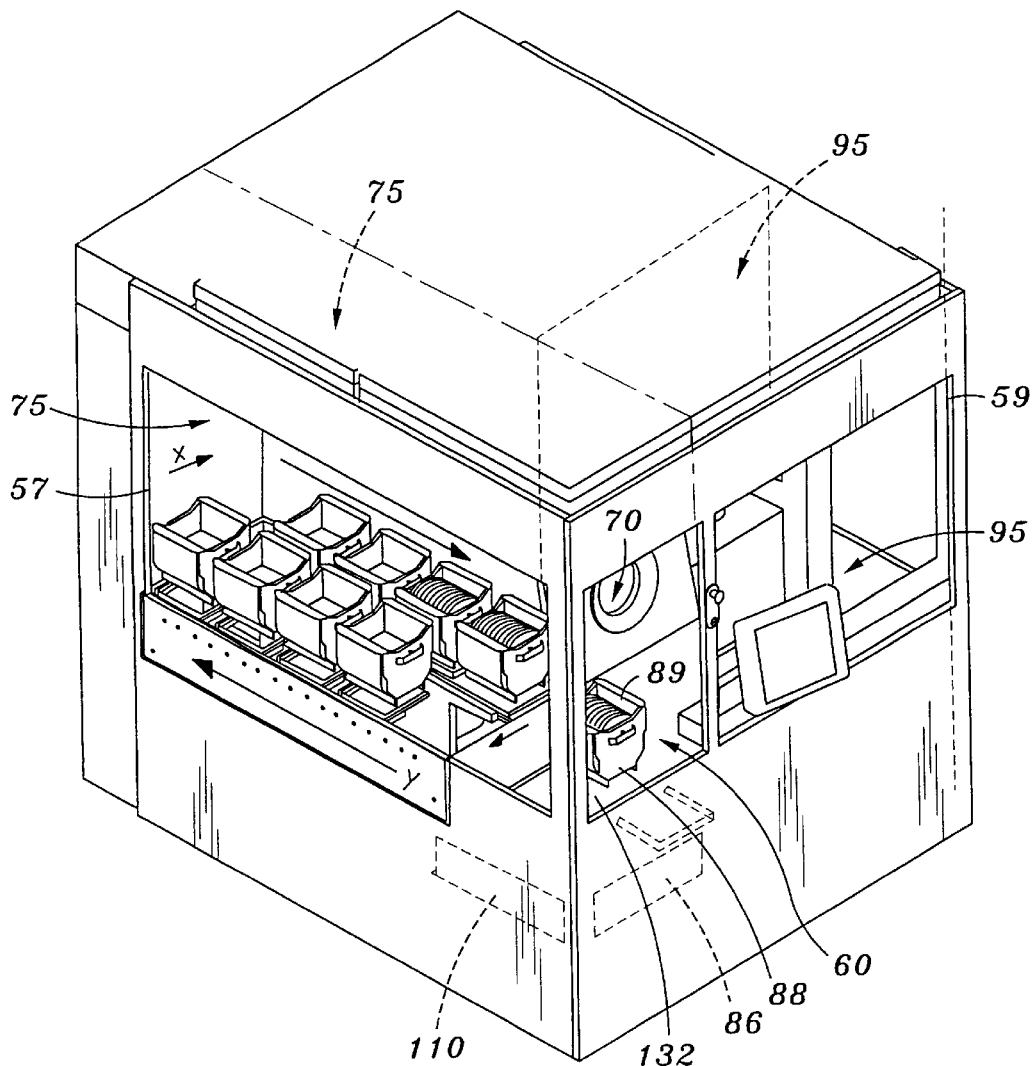

Referring to FIGS. 1–4, and especially to FIG. 3, the system 50 includes an indexer bay or space 75 extending rearwardly along the left side wall 56. A process bay or space 94 extends along the front wall 58, perpendicularly to the indexer bay 75. The indexer bay or space 75, and a process bay or space 95 are continuous with each other, and are designated and illustrated schematically in FIG. 3, as separate spaces only for purposes of description. Referring to FIGS. 1–5, the loading/unloading window 60 opens through the front wall 58 of the enclosure 54 into the indexer bay 75. An I/O robot 86 in the indexer bay 75 is located largely below the opening 60.

An indexer 72 is provided in the indexer bay 75, generally in alignment with the opening 60. An input plate 132 on the indexer 72 extends over the I/O robot 86 toward the window 60. The indexer 72 preferably holds up to eight cassettes 88 containing flat media, e.g., silicon wafers 90. The cassettes 88 rest on pallets 136 on the indexer 72. The pallets 136 and the I/O plate 132 are vertically positioned at about the same elevation as the bottom of the opening 60. A moving buffer shelf 76 is supported above the cassettes 88 on the indexer 72 via a vertical buffer plate 130 extending up from a center beam in the indexer 72.

Figure 4:
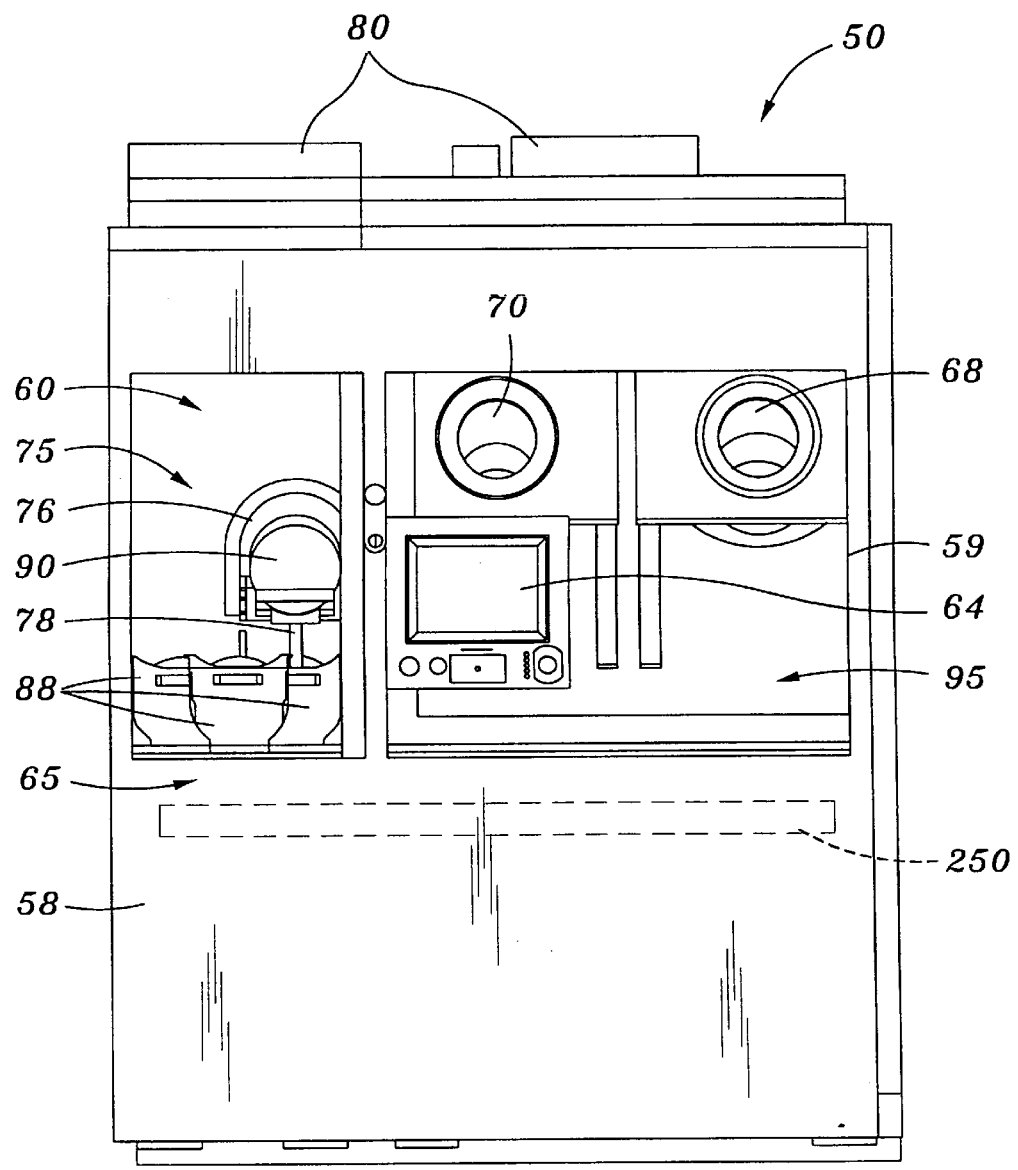
FIG. 4 is a front elevation view thereof.

Referring to FIGS. 2, 3 and 4, the process bay 95 includes two or more process chambers. In the embodiment shown, the process chambers are a chemical process chamber 68, and a spin/rinser dryer 70. A process robot 66 moves through the process bay 95 to the indexer 72, to carry wafers 90 to or from the chambers 68 or 70.

Figure 5:
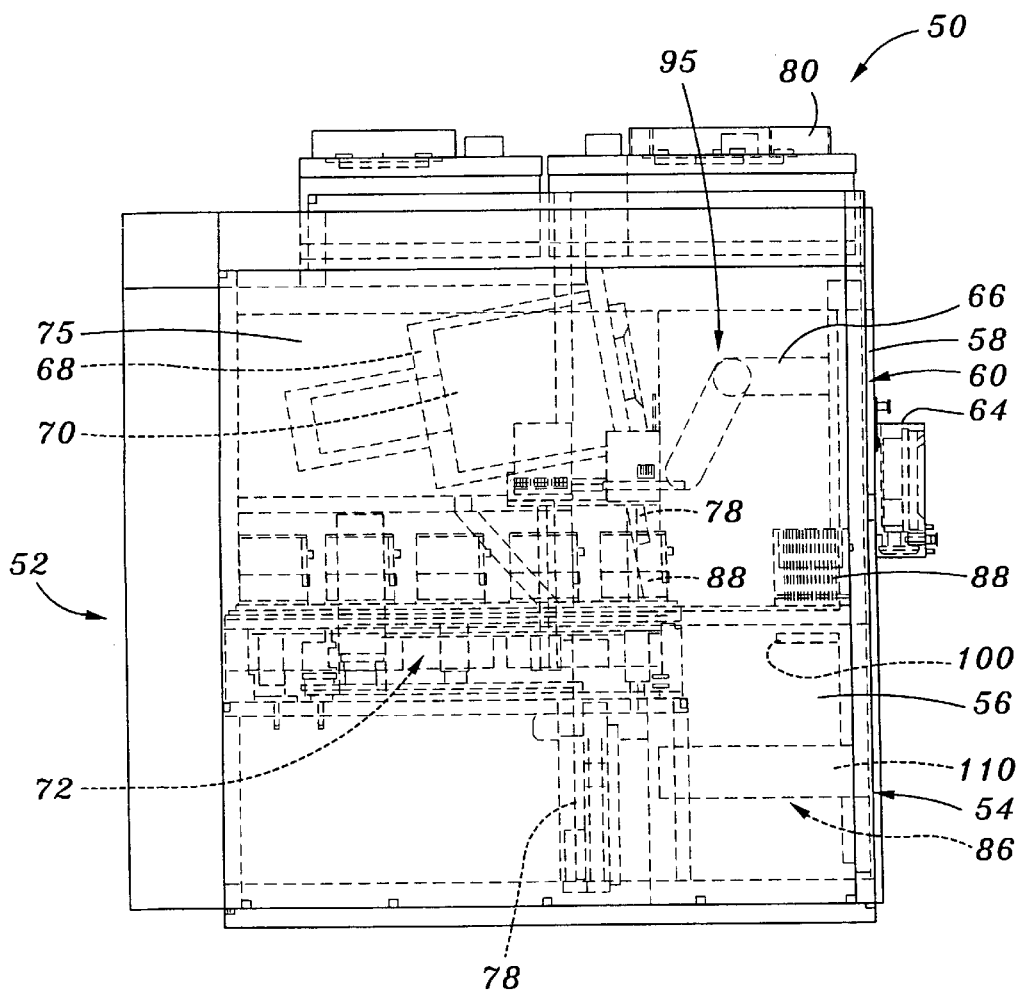
FIG. 5 is a left side view thereof.

Referring to FIGS. 3 and 5, and momentarily to FIGS. 15 and 16, an elevator 78 under the indexer 72 lifts the wafers 90 out of the cassettes 88 (2 cassette loads at a time) so that they can be picked up and carried by the process robot 66. As shown in FIG. 16, each cassette 88 preferably holds 25 wafers, with the eight cassette capacity of the indexer 72 holding 200 wafers. The wafers are handled in batches of 50, as the elevator 78 and process robot 66 carry the combined contents of two cassettes simultaneously.

The I/O Robot

Figure 6:
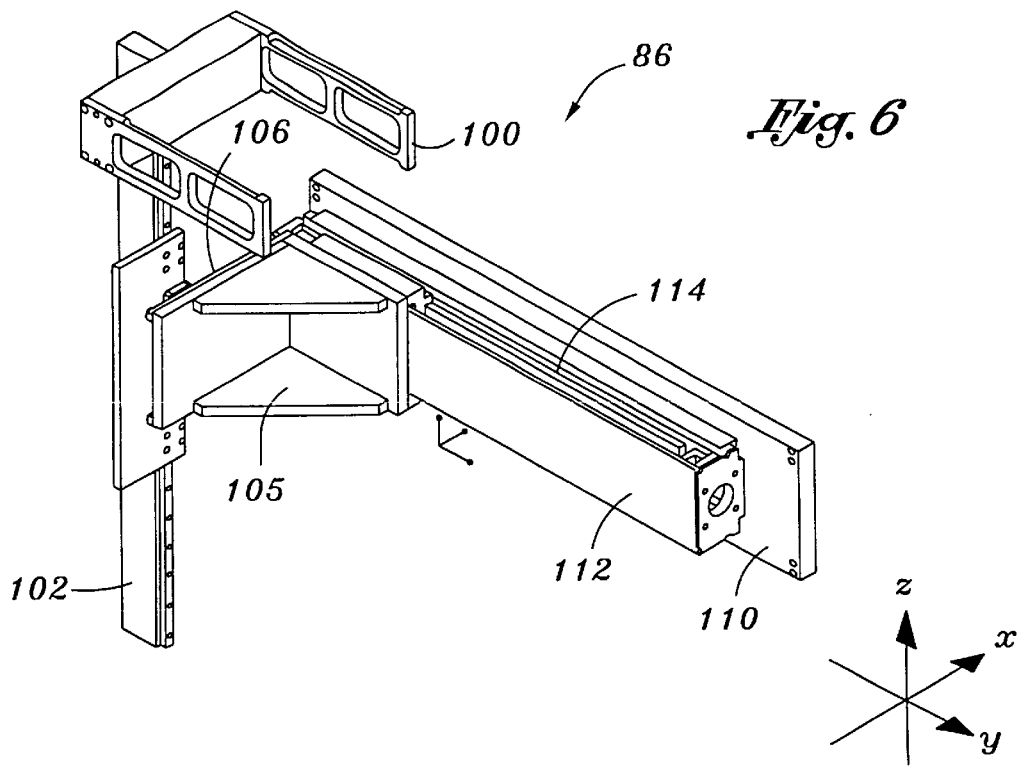
FIG. 6 is a front perspective view of the input/output robot shown in FIG. 3.
Figure 7:
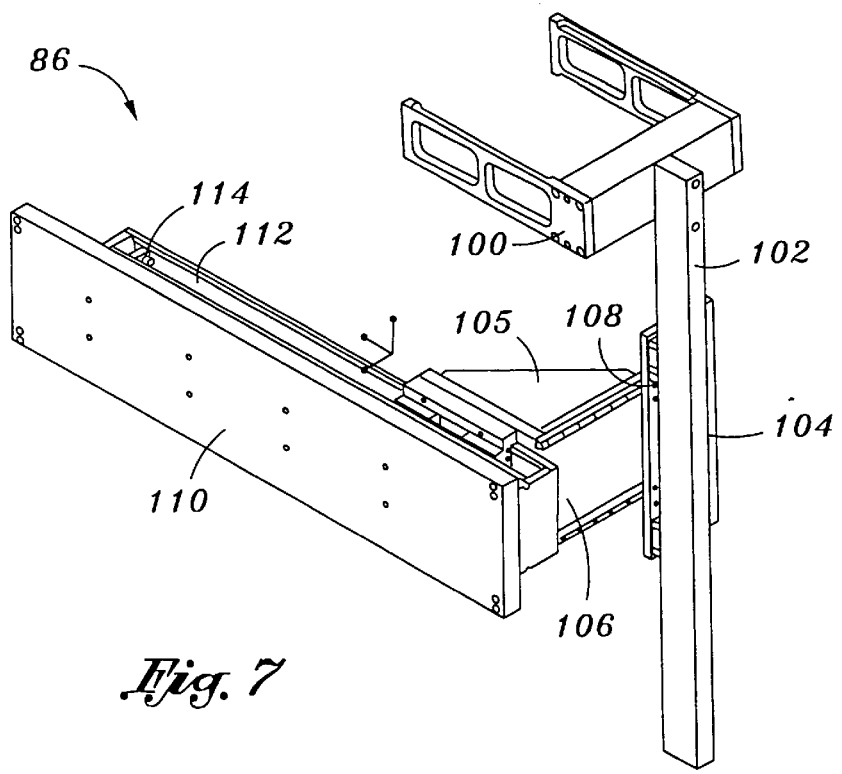
FIG. 7 is a rear perspective view thereof.

Referring to FIGS. 6 and 7, the I/O robot 86 has a mounting plate 110 attached to the left side wall 56 or adjacent enclosure structure. A Y-axis rail 112 is supported on the mounting plate 110. A linear actuator 114 on the rail 112 moves an armature 105 in the Y direction, as shown in FIGS. 3 and 6.

Referring to FIG. 7, an X-axis rail 106 on the back of the armature 105 supports a Z-axis or vertical fork rail 102. A vertical fork actuator 104 moves the rail 102 vertically on the armature 105. An x-axis actuator 108 moves the vertical rail 102, along with the vertical actuator 104, in the X or lateral direction. A cassette fork 100 near the top of the vertical rail 102 is adapted to lift a cassette 88 by engaging the cassette side flanges 89.

The Indexer

Figure 8:
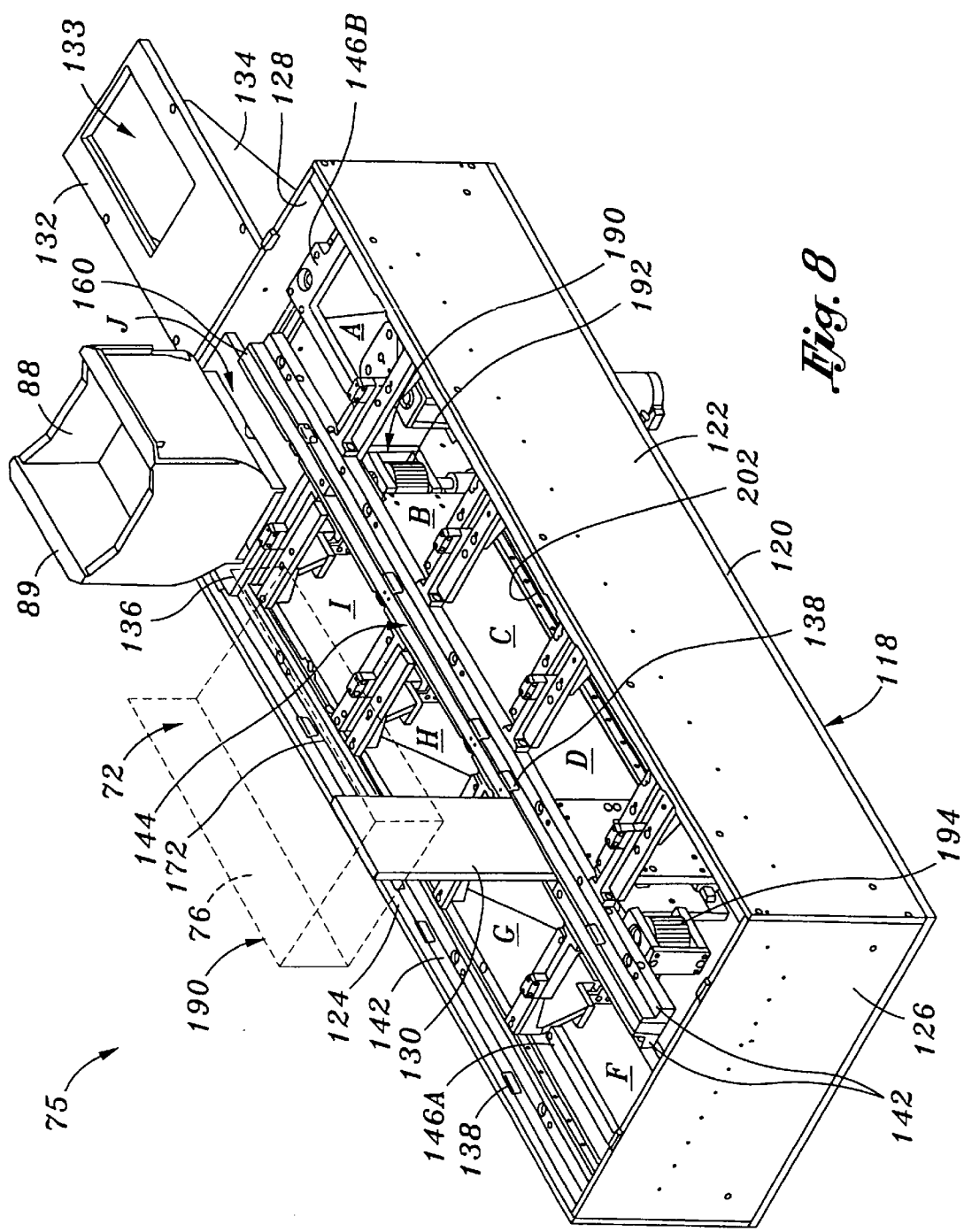
FIG. 8 is a perspective view of the indexer shown in FIGS. 1–3, with various components removed for clarity of illustration.
Figure 14:
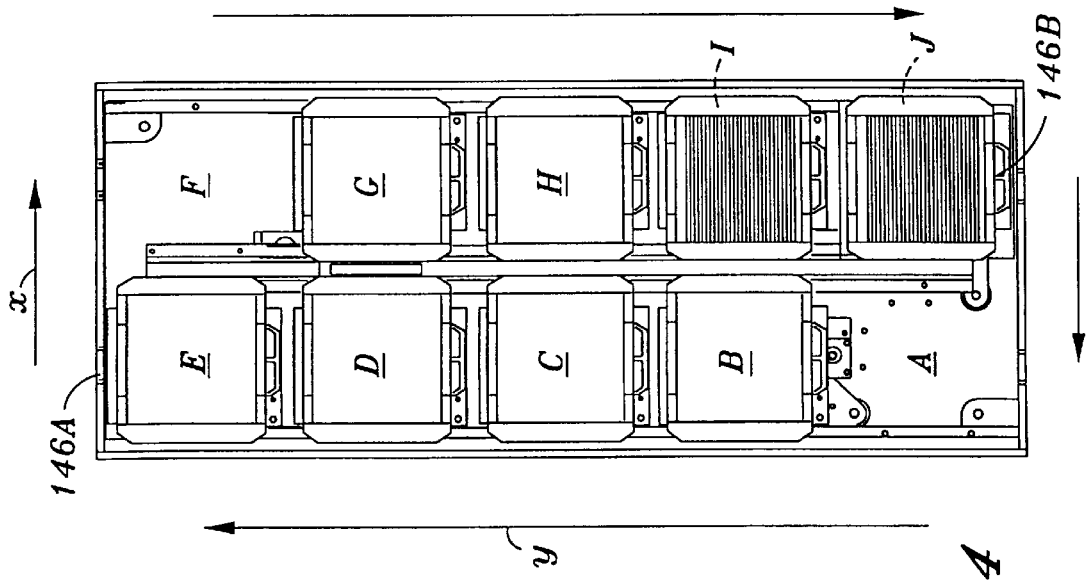
FIG. 14 is a plan view of the indexer shown in FIGS. 1–3, and illustrating sequences of movement.
Figure 13:
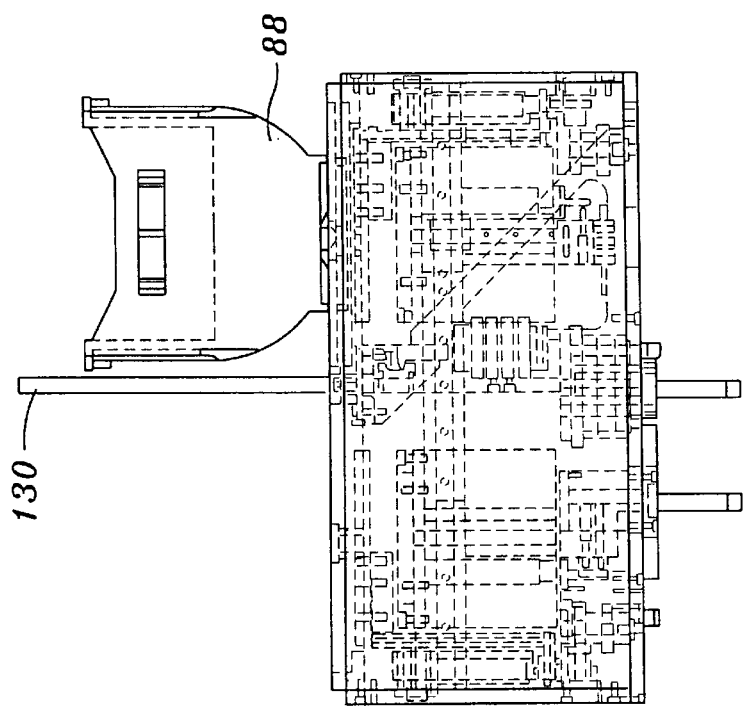
FIG. 13 is a front view of the indexer shown in FIGS. 1–3.

Turning now to FIG. 8, the indexer 72 has a rectangular frame 118 including a bottom plate 120, a front plate 122, a back plate 124, and left and right-end plates 126 and 128. The I/O plate 132 is attached to the right end plate 122, and braced by gussets 134. A center beam 160 divides the indexer into an input row or side 135 and an output row 137. The vertical buffer support plate 130 is positioned and moves back and forth within a centrally located buffer plate slot 144 in the center beam 160. Two pairs of opposing pallet rails 142 extend substantially from the left end plate 126, to the right end plate 128, and provide resting or supporting surfaces for the pallets 136 at the pallet deck or surface 139. Referring momentarily to FIG. 14, the indexer 72 includes 10 pallet positions: A, B, C, D, E, F, G, H, I, and J. The indexer 72 has eight pallets 136, so that two positions, at diagonally opposite corners, are always vacant. Turning to FIG. 12, cutouts 162 in the bottom plate 120 of the indexer 72, at positions C and H, allow air to flow downwardly through the indexer 72. Elevator clearance holes 164 through the bottom plate 120, at positions I and J, provide clearance for the elevator 78.

Referring still to FIGS. 8–14, the indexer 72 includes a X-axis or lateral shift system or assembly generally designated 140, and a longitudinal or a Y-axis shift system or assembly, generally designated 170. These shift systems move the pallets 136 carrying the cassettes 88 around on the indexer 72, as shown in FIG. 14.

Figure 9:
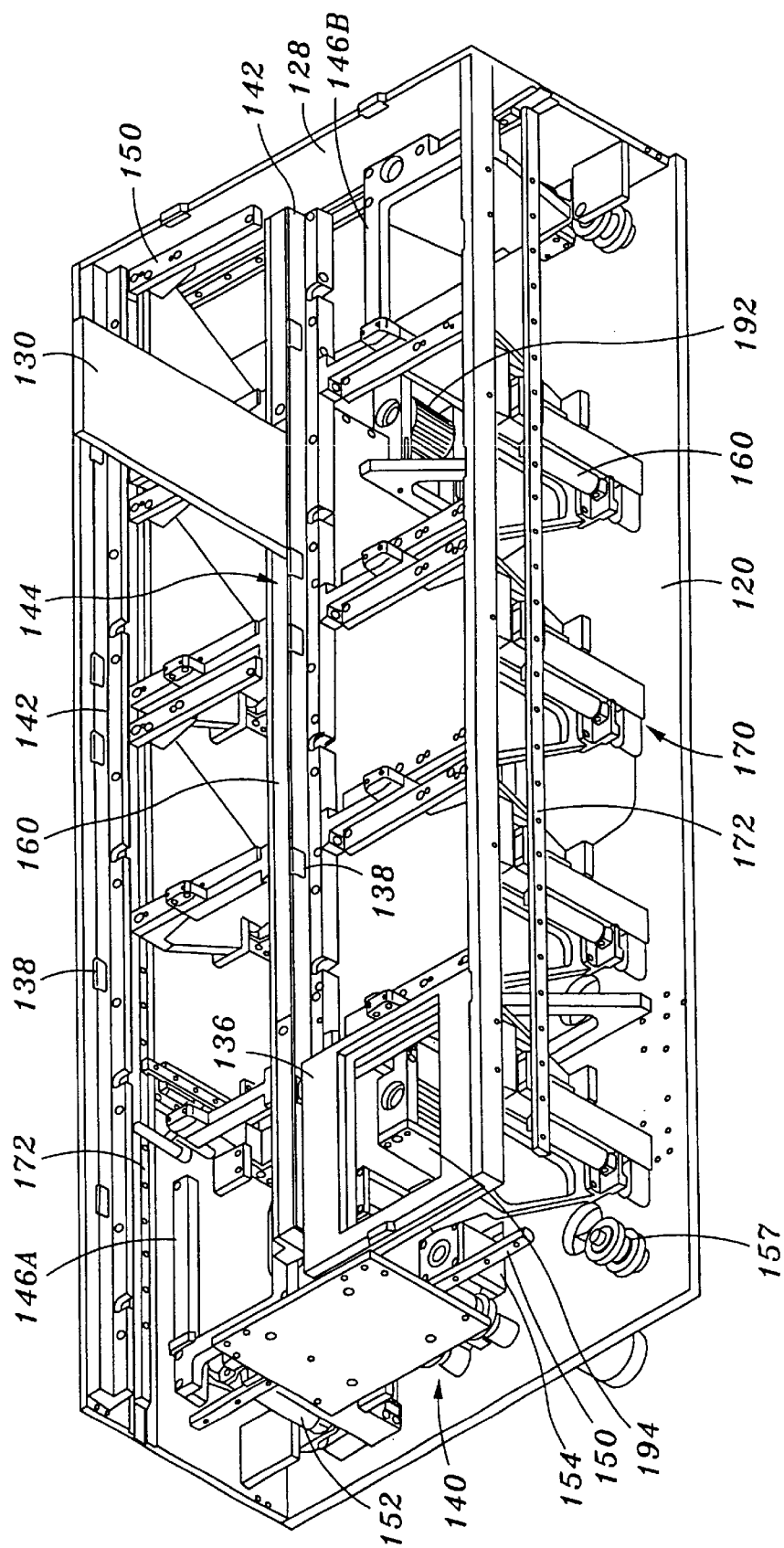
FIG. 9 is a perspective view thereof with additional components removed for clarity of illustration.
Figure 10:
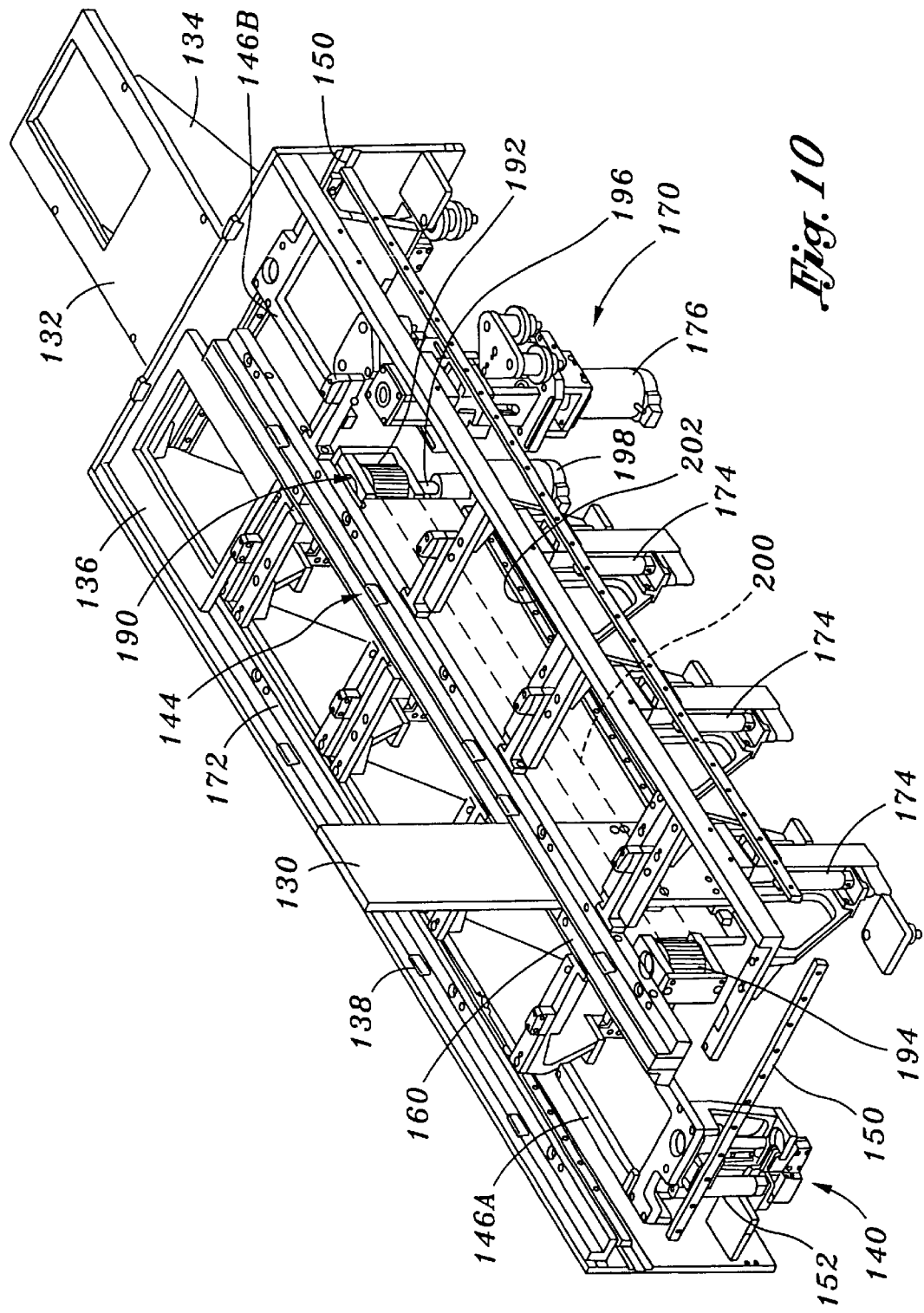
FIG. 10 is yet another perspective view thereof showing additional details.

As best shown in FIG. 9, the lateral shift system 140 includes a lateral guide block 150, fixed to the indexer frame 118. A lateral shift end fork 146A is supported on the lateral guide block 150, and is driven by a lateral drive motor 154 to step or sequence between positions E and F, as shown in FIG. 14. An end fork air cylinder 152 raises and lowers the end fork 146A between fixed up and down positions which are fixed by mechanical stops. FIGS. 9 and 10 show components of the lateral shift system 140 at the left or inside end of the indexer 72. Similar or duplicate components (the lateral guide block 150; an end fork 146B and a lateral air cylinder 152) are mounted at the right end as well. A lateral shift system linking belt 156 extends around the perimeter of the indexer frame 118, supported by idlers 157, and is attached to the diagonally opposite end forks 146A and 146B. When the lateral drive motor 154 is energized, end fork 146A moves from position F to position E, while end fork 146B simultaneously moves from position A to Position J, and vice versa.

Referring still to FIGS. 8–14, the longitudinal or Y-axis shift assembly 170 of the indexer 72 includes longitudinal guide rails 172 extending parallel to the front and back plates 122 and 124, on either side of the center rail 160. Eight side forks 180B–180J are located at positions B, C, D, E, G, H, I, and J, as best shown in FIG. 12. A side fork actuator or air cylinder 174 is attached to each of the eight side forks 180. The air cylinders 174 are longitudinally displaceable with the side forks 180, as they move back and forth on the longitudinal guide rails 172. The eight side forks 180 are joined together by a longitudinal drive belt 178. The longitudinal drive belt 178 extends in a loop around the perimeter of the indexer frame 118, supported on idlers. The longitudinal drive belt 178 is positioned within the indexer frame 118 vertically above the lateral drive belt 156. A longitudinal or Y-axis drive motor 176 is engaged to the drive belt 178, such that with actuation of the motor 176, all eight side forks 180 move simultaneously. Referring to FIG. 12, when the motor drives side forks 180B–180E in the input row 135 in direction 1, the side forks 180G–180J on the opposite side of the center beam 160B, in the output row 137, move in direction 0.

Referring to FIGS. 8–11, the indexer 72 also includes a buffer shelf shift system or assembly, generally designated 190. The buffer shift system 190 shifts the vertical buffer plate 130, which supports the buffer shelf 76 from the front position shown in FIG. 9 to the rear position shown in FIG. 8. The buffer shelf 76, shown in phantom in FIG. 8 is omitted from the other figures, for clarity of illustration.

Referring primarily to FIG. 10, the buffer shift system 190 includes a buffer drive motor 198 linked to a buffer drive belt 200 through a flex coupling 196, and a buffer capstan 192. The buffer drive belt 200 extends around the capstan 192 and a buffer belt idler 194, positioned at opposite ends of the buffer plate slot 144. The vertical buffer plate 130 is secured to the buffer drive belt 200. The bottom end of the vertical buffer plate 130 is slidably attached to a buffer plate guide rail 202 underneath the buffer plate slot 144.

The indexer 72 has three sets of sensors 138 at each location A–J. The three sensors at each location may be separate individual sensors, or a single combination sensor. The sensors, at each position, sense whether a pallet is present; whether a cassette is present on a pallet; and whether wafers are present in a cassette. The sensors are linked to a controller or computer and provide status information for each location in the indexer 72. Preferably, optical sensors are used.

Turning now to FIGS. 15 and 16, the elevator 78 has a motor 210 linked to an armature 212 through a lead screw or other rotation to linear drive. Wafer platforms 216 are supported on lift columns 214. Actuation of the motor 210 lifts the armature 212 up along a elevator rail 215, to vertically move the wafers 90 into and out of the cassettes 88. With the wafers 90 lifted out of the cassettes 88 as shown in FIG. 16, they can be picked up by the process robot 66.

The Process Robot

Figure 22:
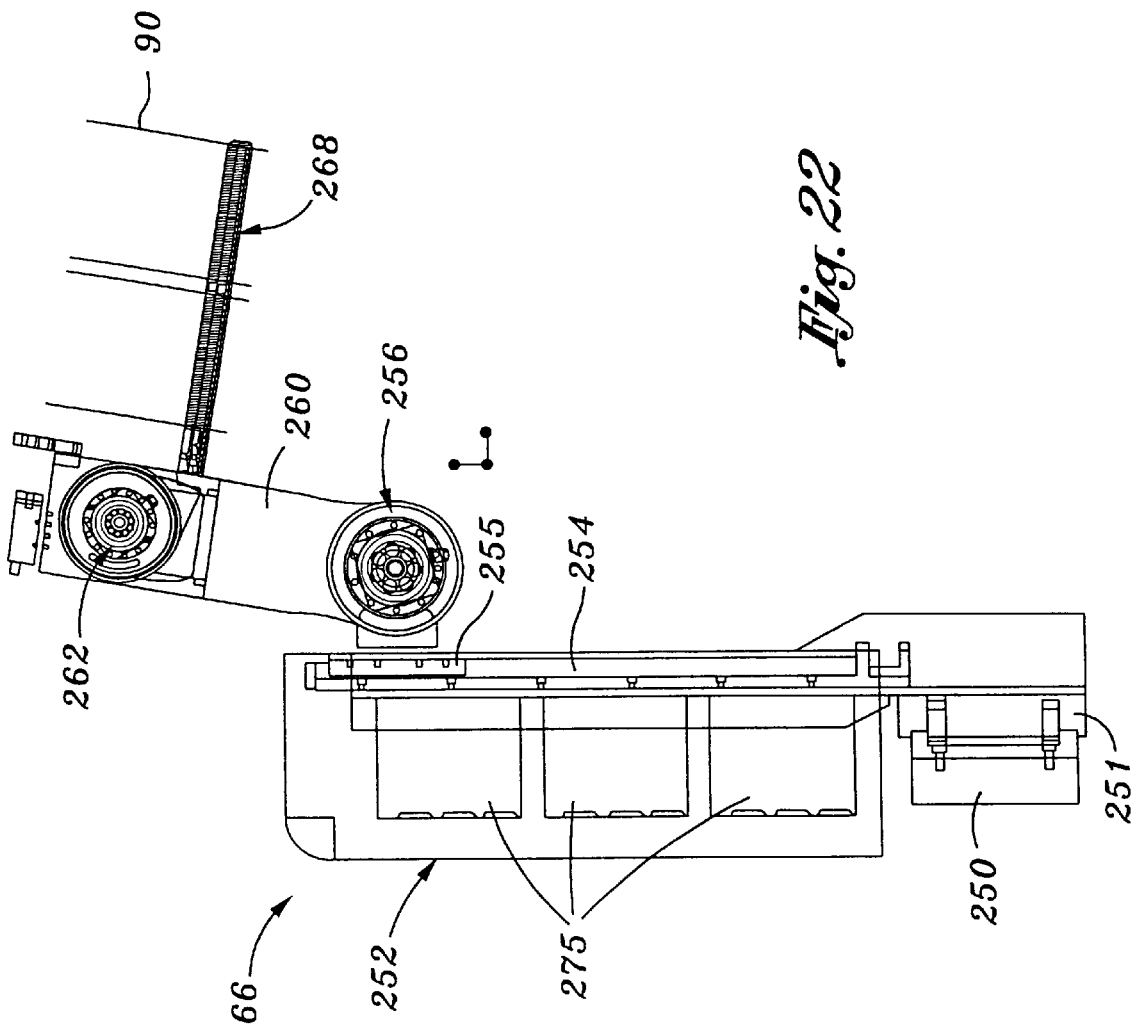
FIG. 22 is a side elevation view, in part section, of the process robot.
Figure 23:
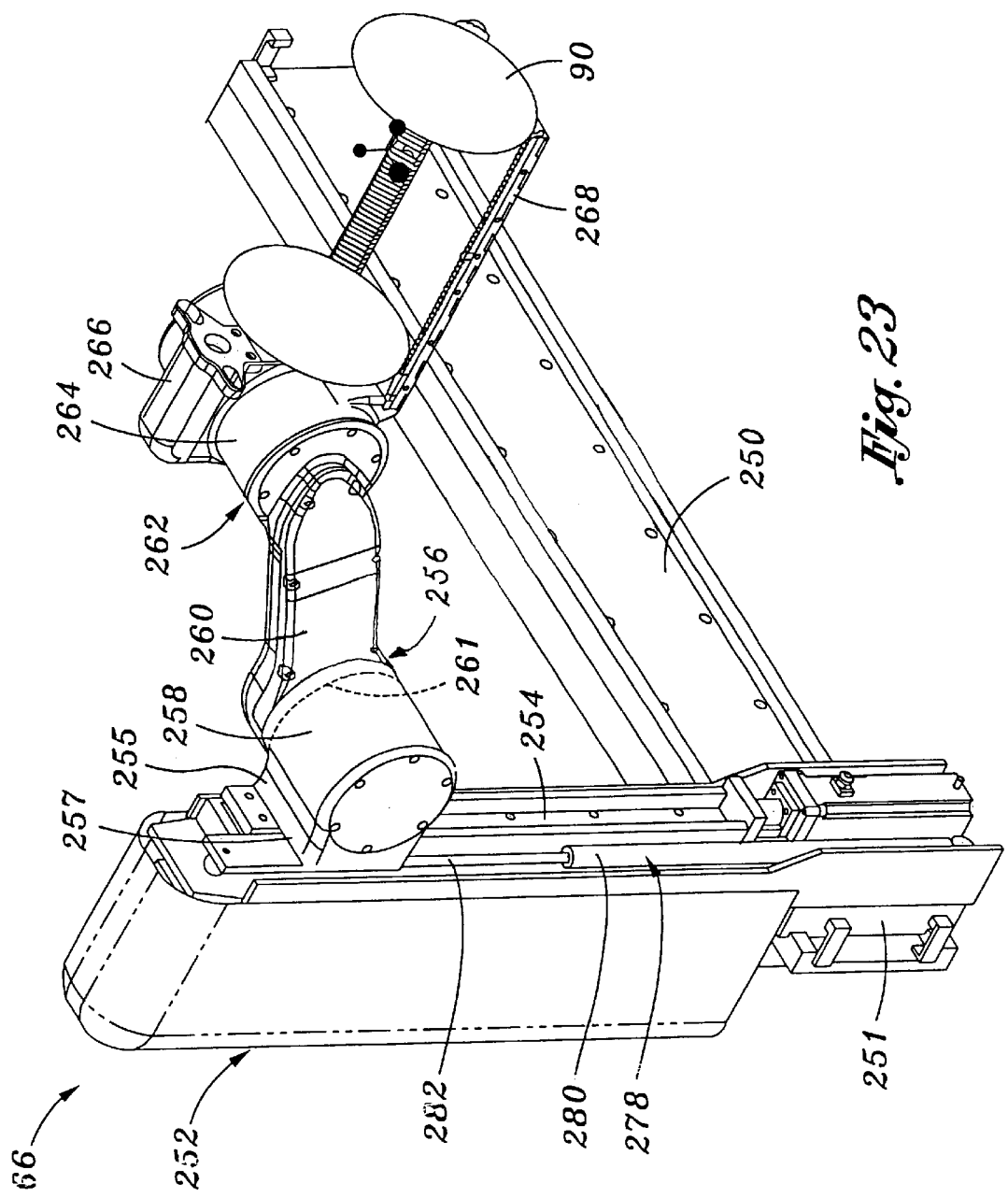
FIG. 23 is a front perspective view of the process robot.

Turning now to FIGS. 17–23, the process robot 66 includes a lateral or X-axis rail 250 extending through the process bay 95 and partially into the indexer bay 75. A lift unit 252 is moveable along the lateral rail 250, driven by a magnetic flux linear drive motor 251. A robot arm, 255, is attached to a vertical lift rail 254 on the lift unit 252. An A/C lift motor 257 moves the robot arm 255 vertically along the lift rail 254. As shown in FIG. 23, the cylinder 280 of a gas spring counter balance 278 is attached to the robot arm 255. A piston 282 extending out of the cylinder 280 is attached to the lift unit 252. The gas spring counterbalance 278 exerts a constant upward force on the robot arm 255, to reduce the lifting or braking force that the lift motor 257 must exert to move or position the robot arm 255.

Referring still to FIGS. 17–23, the robot arm 255 has an elbow drive A/C motor 259 within an elbow housing 258. The elbow housing 258 is attached to the slide of the lift rail 254, on the lift unit 252. A forearm 260 is attached to the elbow housing 258 via an elbow joint 256. The forearm 260 is mechanically coupled to the elbow drive motor 259 via a gear reduction 261.

A wrist drive A/C servo motor 265 is contained within a wrist housing 264 pivotably attached to the outer end of the forearm 260 via a wrist joint 262. A wafer holder 268 formed by opposing end effectors 270 is joined to the lower front area of the wrist housing 264. Grooves 274 in the end effectors 270 facilitate engaging, lifting and carrying the wafers 90. A remote camera head 266 positioned on top of the wrist housing 264, and linked to the computer/controller 85, views the positions of the rotor rotainers within the process chambers (as described in U.S. patent application Ser. No. 08/623,349, incorporated herein by reference). The computer/controller can then determine whether the process robot can properly insert the wafers into the process chamber. The camera head 266 is also used to verify that the rotor retainers are fully locked before processing begins within the process chamber.

Motor amplifiers 275, for driving the wrist drive motor 265, elbow drive motor 259, lift motor 257, and lateral drive motor 251, are contained in and move with the lift unit 252. Locating the motor amplifiers in the lift unit 252 reduces space requirements and cabling requirements.

The Process Module

Figure 25:
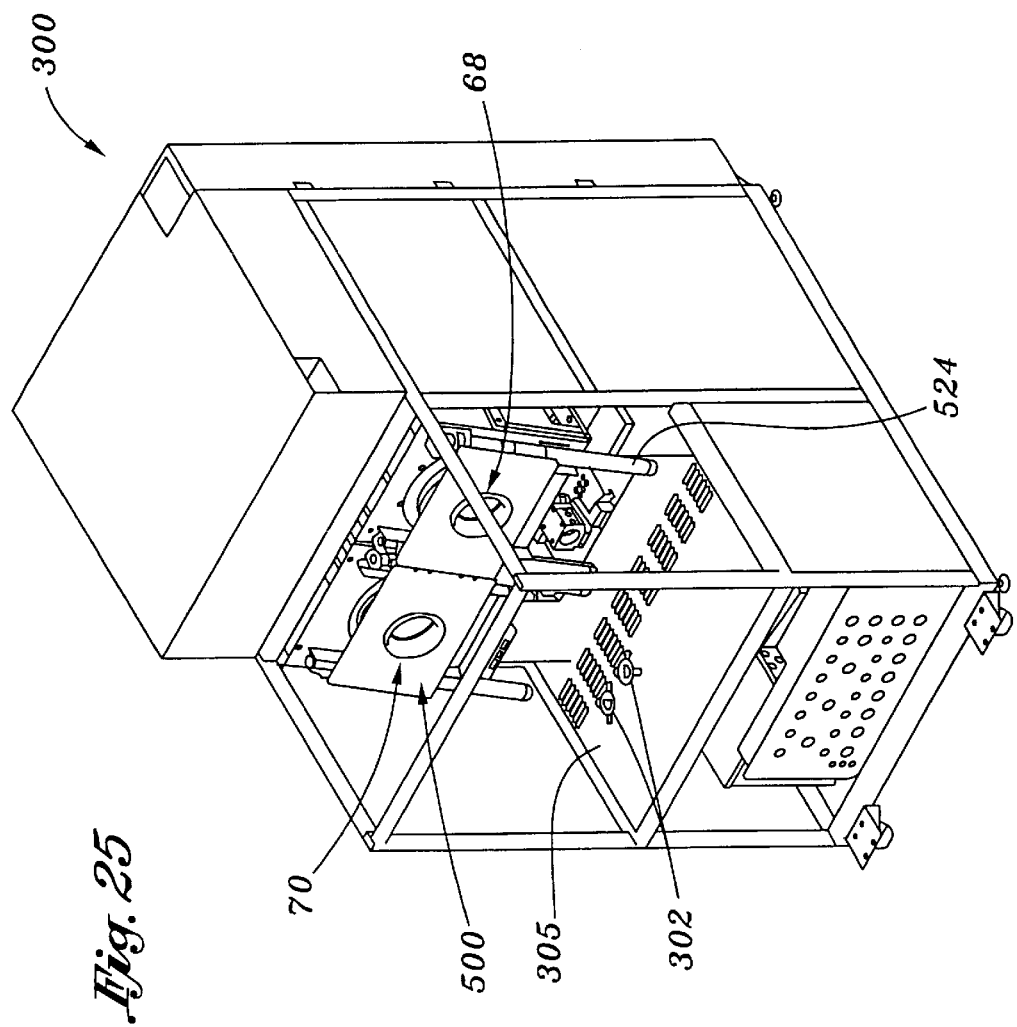
FIG. 25 is a perspective view of a process module, as shown in FIGS. 3–5.

Turning now to FIG. 25, a process module 300 in the process bay 95 includes, for example, the spin rinser dryer 70 and the chemical process chamber 68, although other modules, or additional modules may be used. End effector rinser dryers 302 are provided in the front floor 305 of the process module 300.

Referring to FIGS. 26–29, the process module 300 includes a process vessel 310 which partially encloses a process bowl 314. The process vessel 310 mates with a movable door 512 which can be moved between the closed position shown in solid lines in FIG. 26, and an open position shown in phantom outline.

Figure 26:
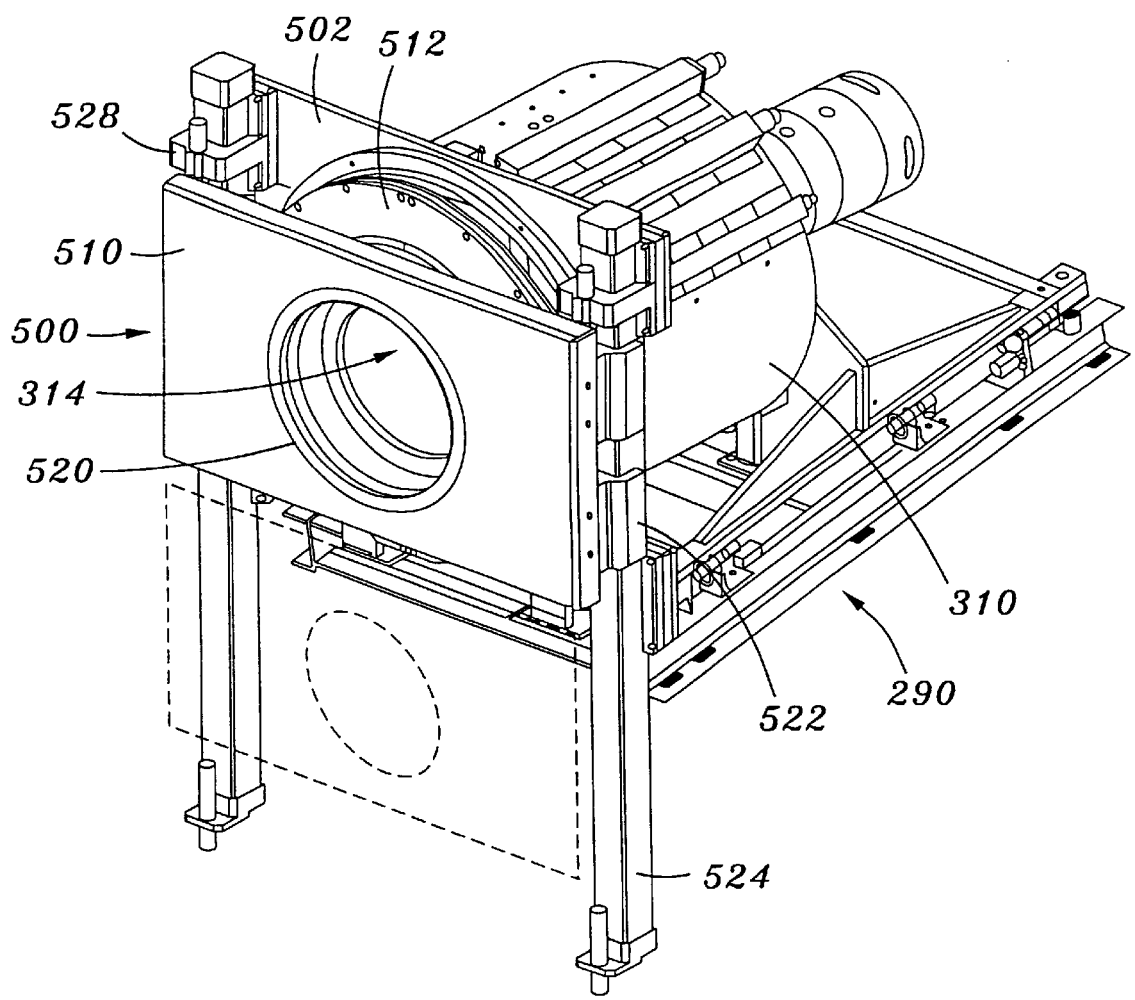
FIG. 26 is a perspective view of the semiconductor process module illustrated in FIGS. 4, 5 and 25, and having a novel door actuation and sealing mechanism.
Figure 27:
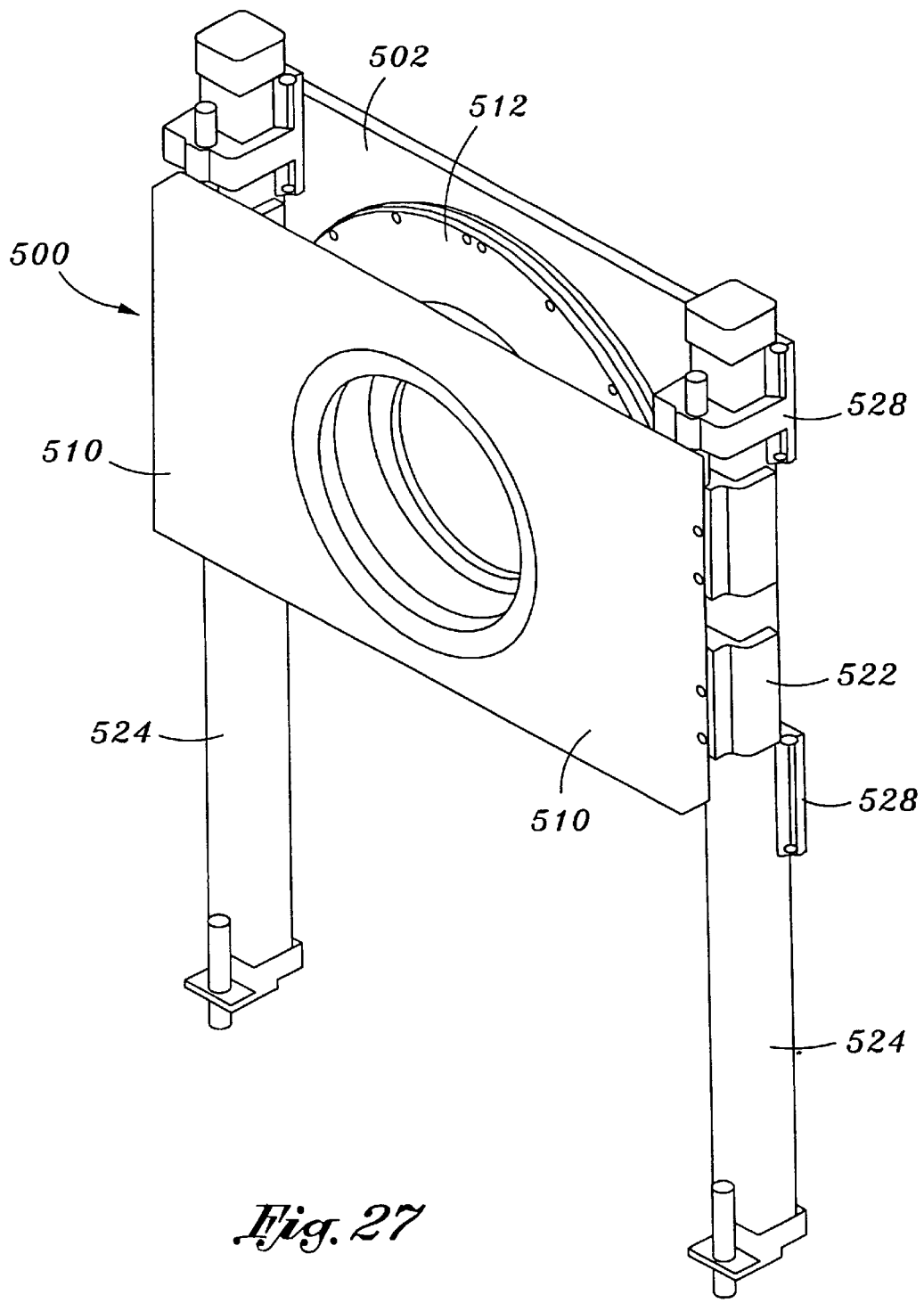
FIG. 27 is a perspective view of the process module door actuation assembly.

Referring to FIGS. 26 and 27, the door assembly 500 is aligned in a fixed position parallel to a front wall 502 of the process vessel 310.

The door assembly 500 includes a door plate 510 supporting a door 512 and a door actuator 514 generally designated 514. The door 512 includes a stiffening plate 504 having a viewing window 508 that permits visual inspection of the processing bowl or chamber 314. The door actuator 514 includes a stationary outer cylinder 516 coupled to the door support plate 510, and an extension ring 518. The extension ring 518 is concentrically and slidably positioned inside of the outer cylinder ring 516. The door support plate 510 includes a viewing aperture 520, which aligns with the window 508, when closed, for providing visibility into the processing chamber.

Referring to FIGS. 26 and 27, the door support plate 510 is attached on each side to slideable guide brackets 522. Each guide bracket 522 is slidably mounted to a pneumatic cylinder 524. The cylinders 524 are connected to the front wall 502 of the processing vessel via mounting plates 528. The combination of the guide brackets 522, the cylinders 524, and the mounting plates 528 provides a rigid door mounting construction that needs no additional guides or support blocks. The guide brackets 522 are mounted for substantially vertical movement so that the door assembly can be moved between an open position to allow access into the bowl of the processor, and a closed position wherein the door assembly is in substantially concentric alignment with the bowl 314. In the closed position, the door can be extended and sealed against the bowl 314 of the processor.

Figure 28:
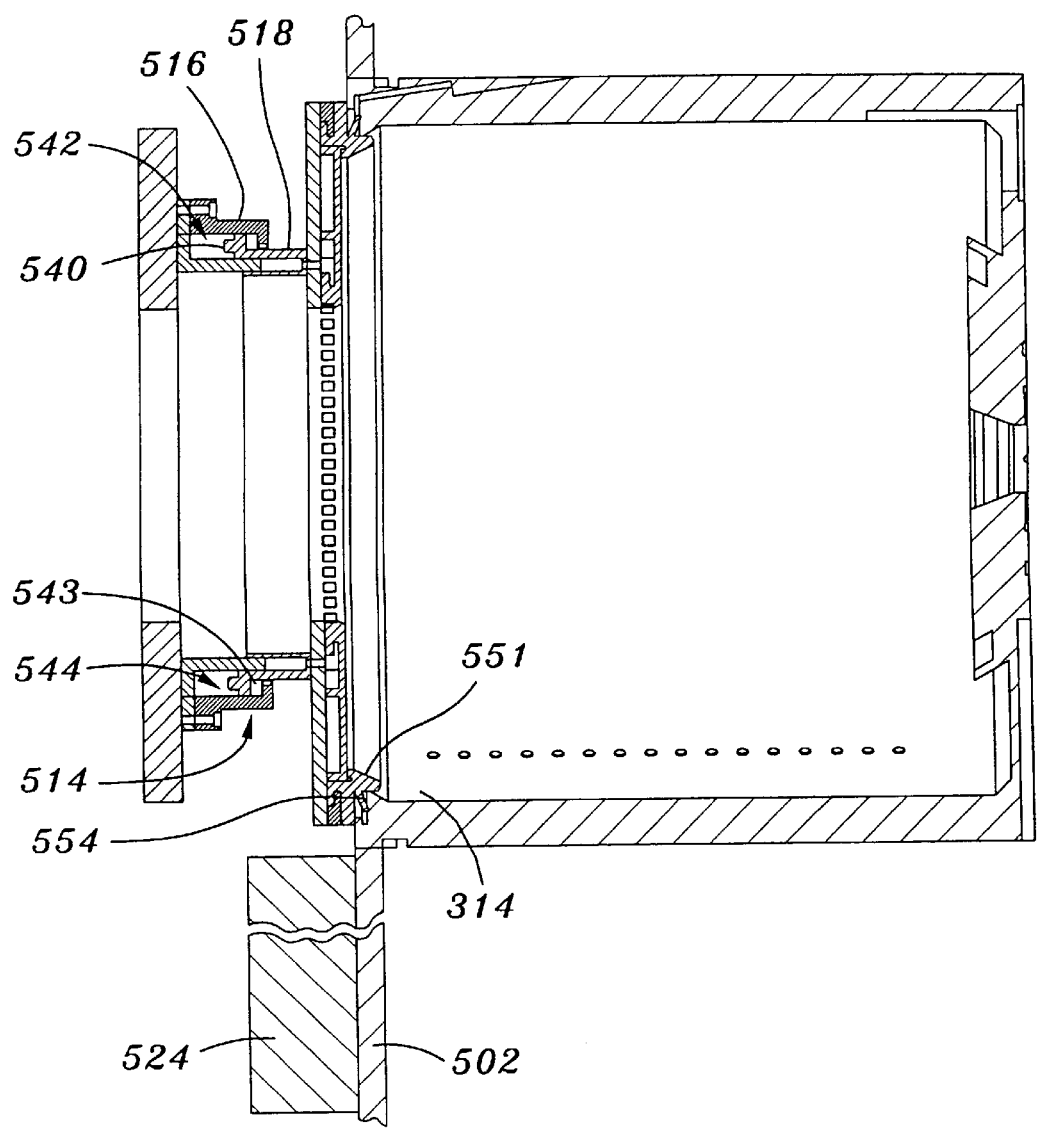
FIG. 28 is a cross-sectional side view of the process module door in an open position.
Figure 29:
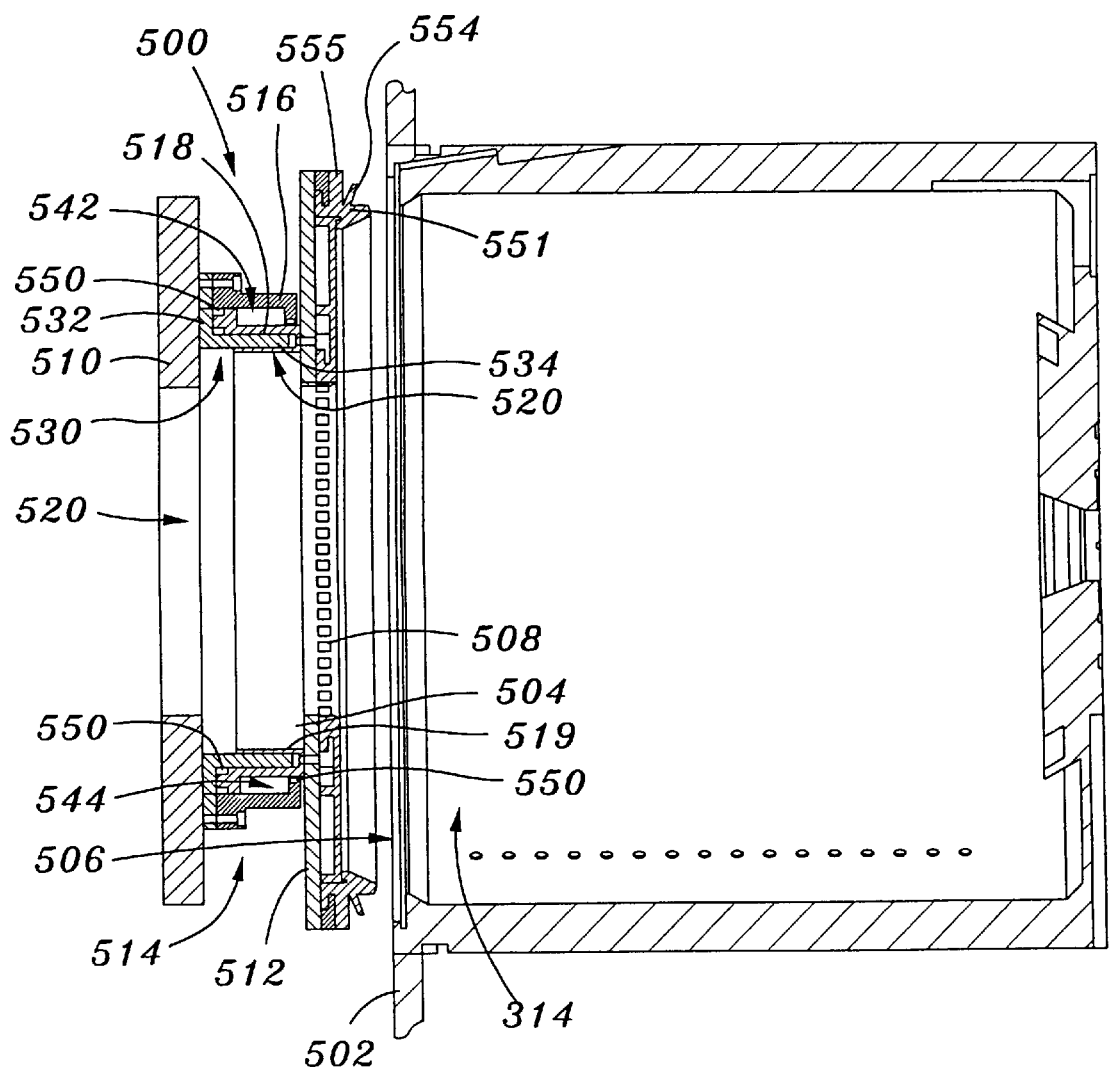
FIG. 29 is a cross-sectional side view of the process module door in a closed position.

Referring to FIGS. 28 and 29, an annular inner hub 530 has an annular flange 532 and a cylinder 534. The annular flange 532 is attached to the door support plate 510. A plurality of fasteners secure the outer cylinder ring 516 and the annular flange 532 concentrically to the mounting plate 510.

The extension ring 518 is concentrically positioned between the hub 530 and the outer cylinder ring 516, and includes a U-shaped portion 519 that defines an annular guide receptacle 520. The cylinder 534 fits within the annular guide receptacle 520. The extension ring 518 also includes an annular end face 540, as shown in FIG. 28. The extension ring 518 is displaceable with an annular chamber 542 defined by the cylinder 534 and the other cylinder ring 516, to seal and unseal the bowl 314.

The extension ring 518 bifurcates the chamber 542 into two operative compartments: a retraction chamber 543 and an extension chamber 544. Each chamber is adapted to hold pneumatic or hydraulic fluid and act as pneumatic or hydraulic cylinder. Multiple annular seals 550 are positioned on or against the extension ring 518 to seal the chambers 543 and 544.

Separate fluid supply conduits are preferably provided to the retraction chamber 543 and the extension chamber 544 to increase or decrease fluid pressure within the respective chambers and effectuate movement of the extension ring 518. As shown in FIG. 28, when hydraulic fluid is supplied to the extension chamber 544, the extension ring 518 moves away from the door support plate 510. Movement of the extension ring 518 into the extended position shown in FIG. 28 moves the door 512 into sealing engagement with the access opening 506 of the processor bowl, thereby sealing the process module 300.

An annular door seal 551 is mounted on the periphery of the door 512. The door seal includes a lip 552 and a tongue 554. When the door is in the closed position shown in FIG. 28, the lip 552 of the door seal lies in a plane that is within the front wall of the processor, and the tongue presses in sealing engagement against the outside rim of the process bowl 314 thereby making a seal between the door 512 and the process bowl 314. The door seal also preferably includes a flange 555 which acts as a stop for the door seal.

The combination of the extension ring 518 and the door seal 550 provides a highly reliable and effective door closing and sealing mechanism. Piston-like movement of the ring 518 allows it to move the door 512 straight outwardly from the support plate without bowing or bending, and without the need for peripheral adjustments to ensure smooth movement. By seating against the outside rim of the process bowl, the tongue provides an effective fluid tight seal and automatically compensates for any misalignment between the door and the processor.

The inner hub 530 and the outer cylinder ring 516, are rigidly attached to the door plate 510. The door plate, in turn, is fixed relative to the process bowl 514, via the connection of the door plate 510, to the cylinders 524, to the front wall 502.

Consequently, as the extension ring 518 moves outwardly away from the door plate 510, it can press tightly against and seal the bowl 514.

Operation

In use, the operator of the system 50 initiates a loading sequence by entering commands via the user interface 64. The window panel 62 drops down, thereby opening the loading window 60. The operator places a cassette 88 filled with wafers 90 onto the I/O plate 132. The cassette 88 may be initially placed on the I/O plate 132 by a human operator or by another robot. The cutout 133 in the I/O plate positions the cassette 88, so that it may be lifted by the I/O robot, and also allows air to flow downwardly over the wafers 90 in the cassette 88.

The fork 100 of the I/O robot 86 is initially in the same X-Y position as the I/O plate 132. The vertical fork motor or actuator 14 raises the fork 100, until the fork has engaged the side flanges 89 of the cassette 88. The I/O robot 86 then lifts the cassette 88 vertically off of the I/O plate 132, shifts laterally (in the X direction) towards the left side wall 56, via actuation of the lateral motor 108. This movement aligns the now lifted cassette with the input row of the indexer. The I/O robot 86 then moves the lifted cassette longitudinally (in the Y-direction) toward the indexer, until the cassette is aligned above a pallet in position A, via the Y-axis motor 114. The I/O robot then sets the cassette 88 down on the pallet 136 at position A on the indexer 72. If there is no pallet at position A, the indexer 72 must first be sequenced, as described below, to bring a pallet into position A. The I/O robot then returns the fork 100 to its initial position.

With a first cassette 88 resting on a pallet 136 at position A, which is the cassette loading position, the longitudinal shift system 170 moves the side forks 180B–J (in the direction of arrow O in FIG. 12) until the side fork 180B is underneath the pallet 136 and cassette 88 in position A. The end forks 146A and 146B have down or at-rest positions below the down or at-rest positions of the side forks 180B–J, so that the side forks 180B, 180E, 180G, and 180J can move into the end positions A, E, F and J, without interfering with the end forks 146A and 146B. As all of the side forks 180B–J are attached to the longitudinal drive belt 178, they all necessarily move together in the Y direction.

With the side fork 180B underneath the first cassette 88 in position A, the eight side fork air actuators or cylinders 174 are extended, causing the side forks 180 to lift the pallets above them up and off of the pallet deck 139. With the pallets in the up position, the longitudinal drive motor 176 turns in the opposite direction, moving side fork 180B, now carrying the first cassette 88 on a pallet, from position A to position B. The air cylinders 174 are then retracted to lower the pallet 136 and cassette 88 down into position B. After this movement is completed, there is no pallet at position A. As all of the side fork actuators 174 are controlled to move simultaneously, all of the side forks 180B–J necessarily move together in the vertical Z-axis direction.

To continue loading or sequencing the indexer 72, the longitudinal drive motor 176 is again energized to move side fork 180B back towards position A, and thereby move side fork 180J from position J back to position I. During this movement, the side fork air cylinders 174 are down, so that there is no pallet movement. Rather, the side forks are merely repositioned below the pallets. The side forks are moved, in this step, enough to avoid interfering with the end forks, and not necessarily one complete position. With the side fork 180J now clear of position J, the lateral drive motor 154 is energized to move the end fork 146B from position A to position J, and to simultaneously move the end fork 146A from position F to position E. Once under position J, the lateral air cylinders 152 are extended, lifting end fork 146B, and the pallet at position J, and simultaneously lifting end fork 146A to lift the pallet at position E. The lateral drive motor 154 is then energized in the reverse direction (direction L in FIG. 12) and via the lateral belt 156, the end fork 146B carries the pallet from position J to position A, and simultaneously, the end fork 146A carries a pallet from position E to position F. The lateral air cylinders 152 are then retracted, to lower the pallets into positions A and F on the indexer deck 139.

With a second pallet in position A, the indexer 72 is ready to receive a second cassette 88. After a second cassette is positioned on the I/O plate 132, the I/O robot 86 repeats the indexer loading sequence of cassette movements, so that the second cassette is placed on the indexer at position A.

The foregoing sequence of steps is repeated until a cassette is loaded onto each of the eight pallets in the indexer. As the indexer has ten positions A–J, and eight pallets, two diagonally opposite corner positions, either positions A and F, or positions E and J, will, at any given time, not have a pallet.

After the first and second cassettes 88 loaded into the indexer 72 arrive at positions I and J, the elevator 78 is energized, lifting the wafer platforms 216 on the lift columns 214 up through the open bottom of the cassettes 88. The wafers 90 in the cassettes are lifted to an elevated access position, as shown in FIG. 16, where they are now ready to be picked up by the process robot 66.

The window panel 62 moves up to close off the loading window 60, to prevent an operator from inadvertently coming into contact with moving components within the enclosure 54.

Figure 24:
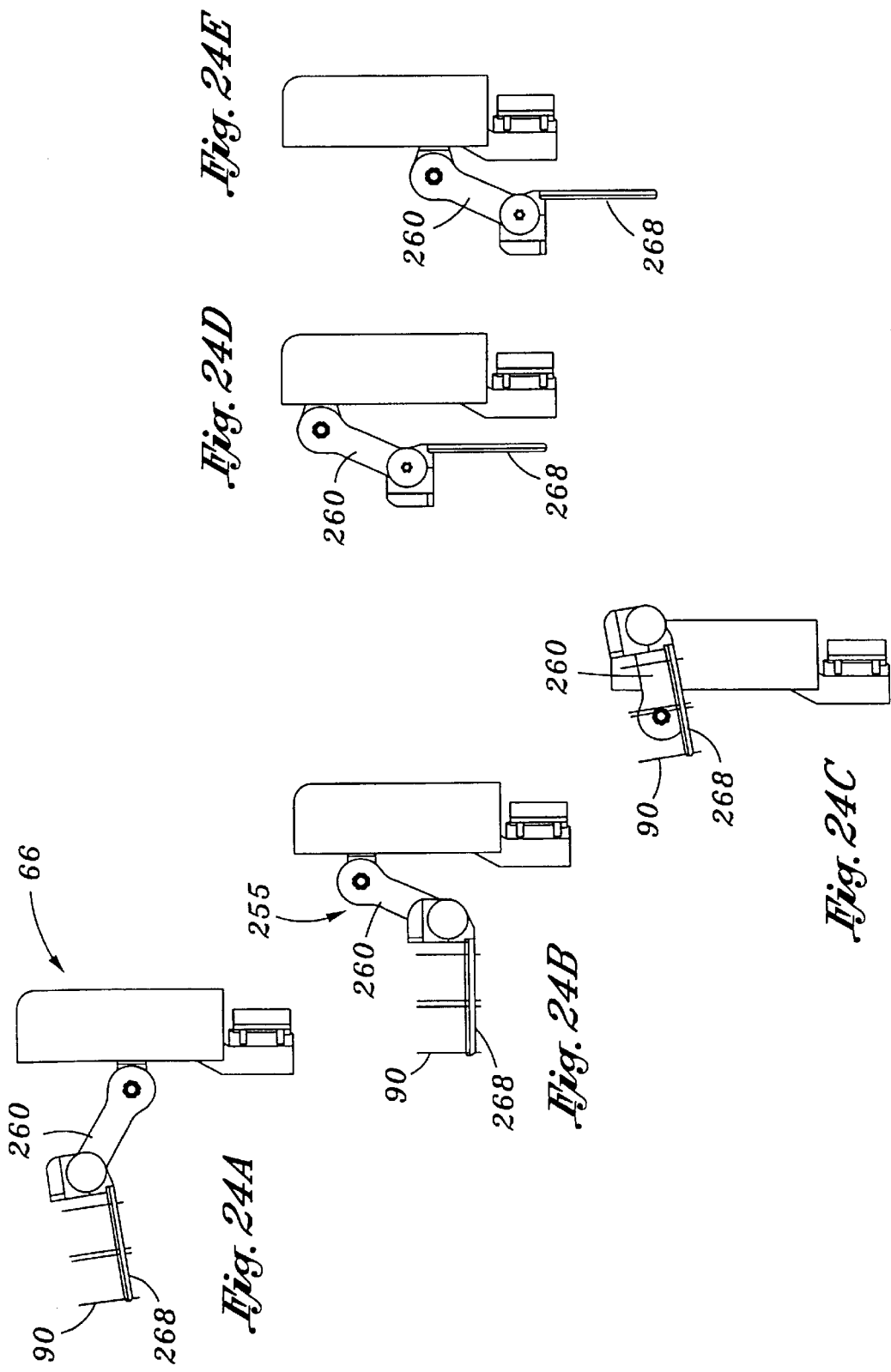
FIGS. 24A–24E are schematic illustrations showing various positions of the arm of the process robot.

Referring now to FIGS. 20, 21 and 24B, the process robot 66 moves to lift the wafers 90 off of the elevator 78. Specifically, the lateral drive flux motor 251 moves the lift unit 252 laterally until the wafer holder 268 is properly aligned with the wafers 90 on the elevator 78. With appropriate control of the lift motor 257, the elbow drive motor 258, and the wrist drive motor 265, the wafer holder 268 is moved in until the end effectors 270 are positioned and aligned on either side of the wafers 90, with the grooves 274 in the end effectors 270 each aligned to receive a wafer. As shown in FIG. 24B, this wafer engagement movement is an underhanded movement of the robot arm 255. The wafer holder 268 is moved up to lift the wafers 90 off of the elevator 78. The robot arm 255 then withdraws to the position shown in FIG. 24C. As the forearm has a 370° range of movement, and robot arm 255 is offset from the lift unit, the robot arm can be fully backed away from the indexer, with only minimal clearance space required, as shown in FIGS. 20 and 21. By appropriate control of the motors in the robot arm, the wafers are maintained in a vertical or near vertical position.

To deliver the wafers 90 to a process chamber, the lateral drive motor 251 is energized to move the lift unit 252 so that the wafers in the wafer holder 268 are brought into alignment with the selected process chamber. The robot arm 255 is raised up on the lift unit by the lift motor 257. In addition, the forearm 260 is pivoted upwardly via the elbow drive motor 259. Simultaneously, the wrist drive motor 265 is driven in an opposite direction to bring or maintain the wafer holder in an approximately 10° down incline orientation, as shown in FIG. 22. Using an overhand movement, as shown in FIG. 24A, the forearm is pivoted downwardly to extend the wafer holder carrying the wafers into the process chamber. The robot arm 255 then withdraws from the process chamber.

To clean the end effectors 270, the wrist drive motor 265 is controlled to orient the end effectors vertically, as shown in FIG. 24D. With the end effectors aligned with the end effector rinser/dryer 302, the lift motor 257 lowers the entire robot arm 255, to extend the end effectors into the end effector rinser/dryer 302. After the end effectors 270 are cleaned and dried, they are withdrawn from the end effector rinser/dryer 302 and positioned to remove wafers from either process chamber, or to pick up additional batches of wafers from the indexer for delivery to a process chamber. As the end effectors are cleaned at the process chamber rather than at another location, processing time can be reduced, because this cleaning step is accomplished without the need to move the process robot.

As is apparent from e.g., FIG. 23, the wafer holder 268 is offset to one side of the wrist joint 262 and elbow joint 256, as well as the other components of the process robot 66. No part of the process robot 66 is ever positioned directly above the wafers. As air is blown downwardly in the enclosure 54, any particles generated or released by the process robot 66 will not come into contact with the wafers. As a result, the potential for contamination of the wafers during processing is reduced.

Referring to FIGS. 24A–24E, the process robot 66 has an elbow joint 256 and a wrist joint 262, joined by a single segment or forearm 260. Consequently, in contrast to earlier known systems having shoulder, elbow and wrist joints, joined by two arm segments, the process robot 66 achieves a range of vertical reach via movement of the robot arm 255 on the lift rail 254, rather than by articulation of arm segments. This allows the process robot 66 to be very compact, while still achieving sufficient ranges of movement. Correspondingly, the entire enclosure 54 can be made more compact.

As the process robot 66 can perform both underhanded and overhanded movements, the vertical travel necessary on the lift rail 254 is limited. In addition, the ability to perform both underhanded and overhanded movements allows the forearm 260 to be relatively short, which also contributes to a compact enclosure 54.

Referring to FIGS. 1 and 16, the buffer shelf 76 moves forward (in direction O in FIG. 17) when the elevator 78 is in the down position, to receive up to 50 wafers. The buffer shelf 76 holds the wafers until the appropriate empty cassette 88 is moved into the I and J positions, so that the process robot 66 can move the disks from the buffer shelf 76 into the cassettes at positions I and J. When the buffer shelf 76 is not being loaded or unloaded with wafers, it remains in the back position (moved in direction I), so as not to interfere with operation of the elevator 78. The buffer shelf 76 temporarily holds already processed wafers, so that the process robot 66 can access and move the next batch of wafers for placement into the process chambers, before off loading already processed wafers back into the indexer. This ensures that the process chambers are constantly supplied with wafers for processing.

Second Indexer Embodiment

Figure 30:
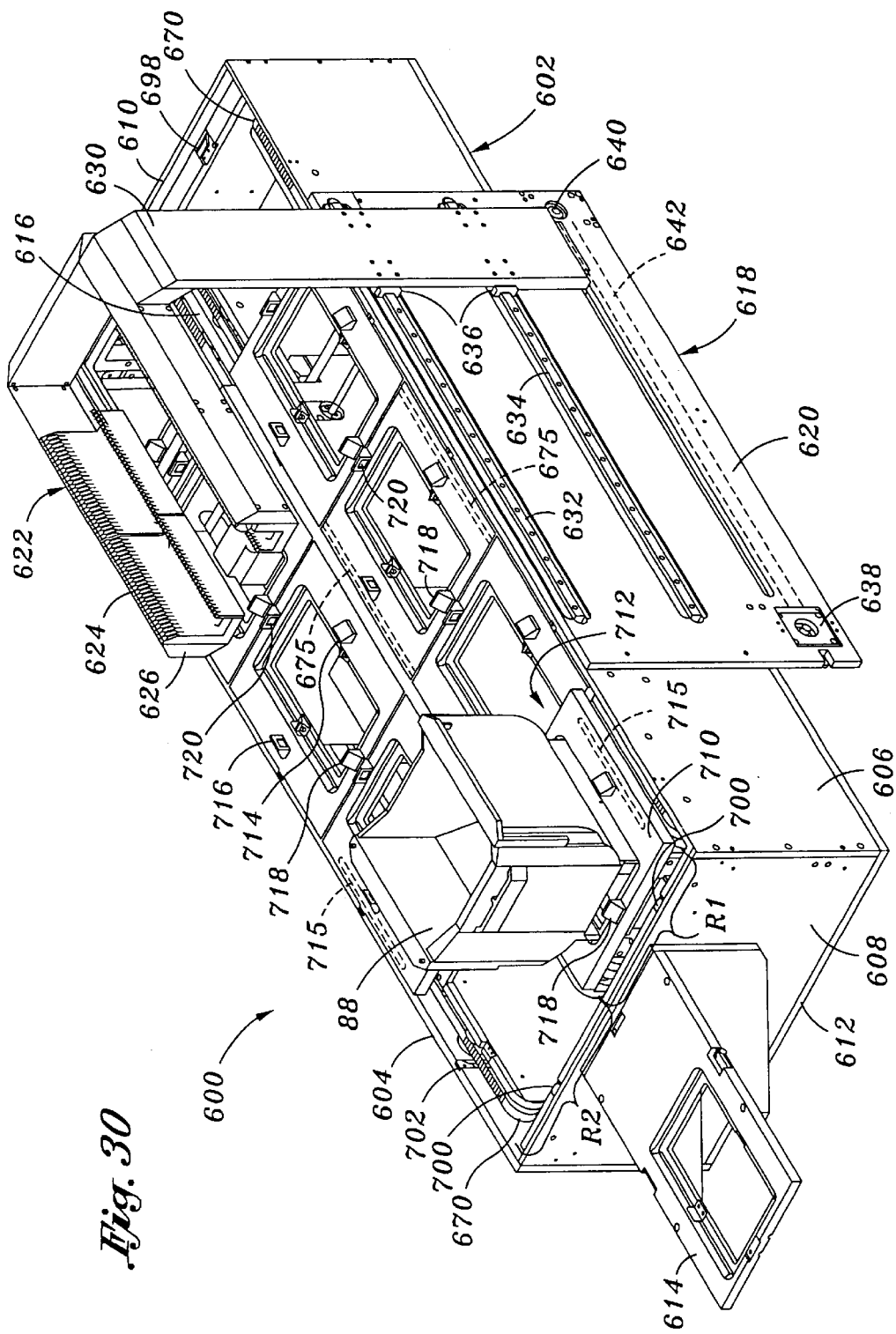
FIG. 30 is a perspective view of a second indexer embodiment.
Figure 31:
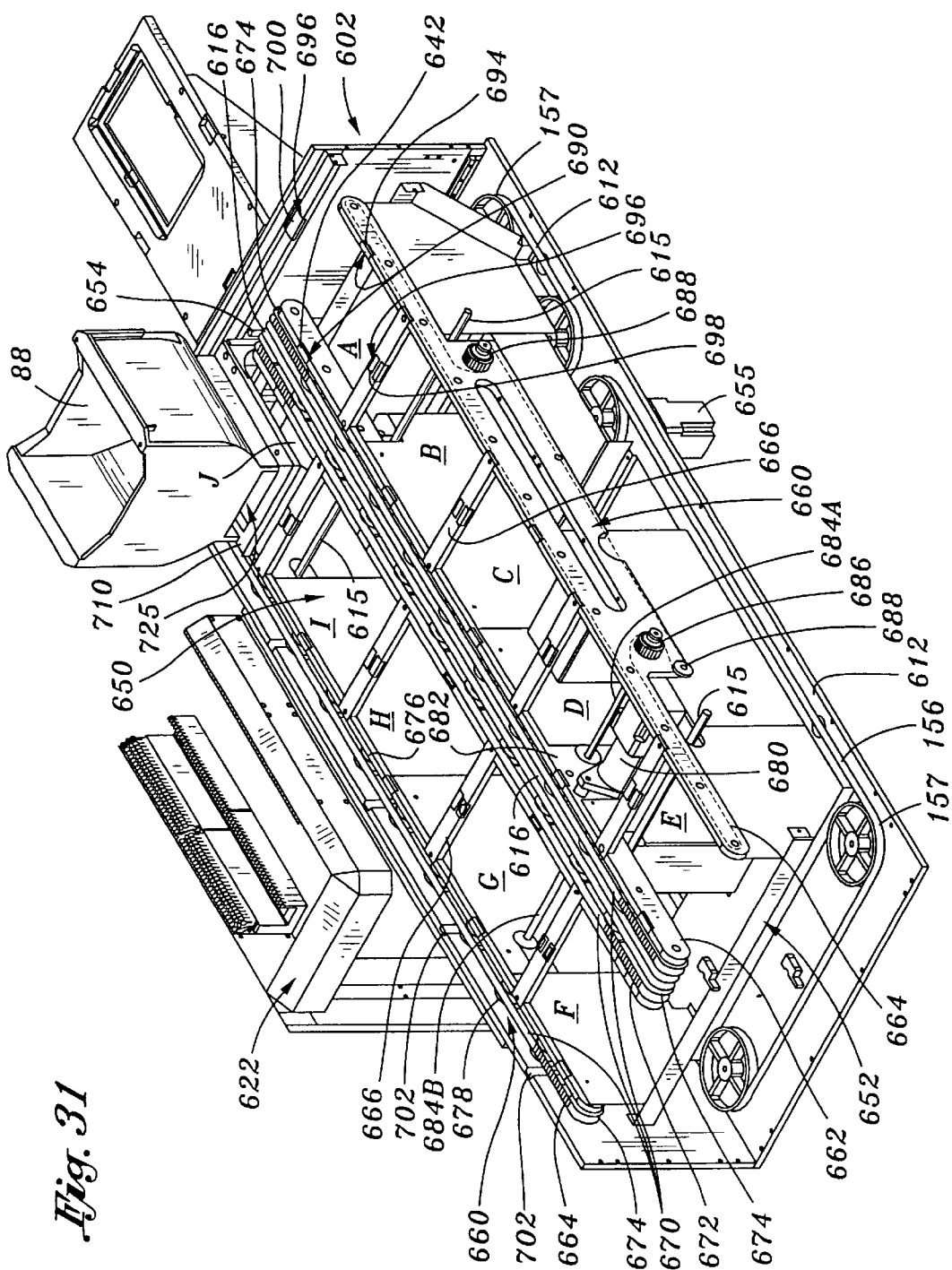
FIG. 31 is a reversed perspective view of the indexer shown in FIG. 30, with various components removed, for purposes of illustration.

As shown in FIGS. 30 and 31, a second embodiment indexer 600 includes a box frame 602 formed by side walls 604 and 606, a front end wall 608, and a back end wall 610, joined to each other, and to a base plate 612. An input plate 614 extends outwardly from the front end wall 608. A center wall 616 and lateral ribs 666, divide the indexer 600 into first and second rows R1 and R2, with each row having 5 pallet positions or stations, i.e., A–E and F–J, as shown in FIG. 12. The center wall 616 is supported in the box frame 602 via support bars 615 extending from the center wall 616 to the side walls 604 and 606.

Referring to FIG. 30, a buffer assembly 618 includes a buffer side plate 620 attached to the inner side wall 606. A buffer tray 622 has combs 624 on comb arms 626. The buffer tray 622 is supported on a buffer tray support 630. The tray support 630 in turn is slidably mounted on upper and lower buffer rails 632 and 634, on the buffer side plate 620. Linear bearings 636 on the tray support 630 allow for low friction movement of the tray support 630 along the rails 632 and 634.

A buffer drive belt 642 extends around a buffer drive motor 638 and an end pulley 640. The buffer drive belt 642 is attached to the buffer tray support, so that rotational movement of the motor 638 causes translational (y-axis) movement of the buffer tray support 630 along the rails 632 and 634. Locating the buffer assembly 618 on the side of the indexer 600, as shown in FIG. 30, allows for a more compact design, in comparison to the centrally located buffer assembly of the first indexer embodiment 72 shown in FIG. 8.

Referring to FIGS. 30 and 31, the indexer 600 includes a longitudinal or y-axis shift assembly, generally designated 650, and a lateral or x-axis shift assembly, generally designated as 652.

Referring to FIG. 31, the y-axis shift assembly 650 includes 2 side by side and parallel y-axis frames 660. Each y-axis frame 660 includes an inner frame plate 662, adjacent and attached to the center wall 616, and an outer frame plate 664, supported on the side walls 604 and 606. The lateral ribs 666 are attached to and extend between the inner frame plate 662 and outer frame plate 664, in both of the y-axis frames 660.

End rollers 674 are rotatably mounted at the ends of each of the inner and outer frame plates 662 and 664 (for a total of 8 end rollers 674). Idler rollers 676 are spaced apart and rotatably mounted on the frame plates 662 and 664, between the end rollers 674, on each frame plate 662 and 664. An endless toothed belt 670 is mounted over the end rollers 674 and idler rollers 676 on each frame plate 662 and 664 (for a total of 4 endless toothed belts 670). The teeth 672 on the belts 670 face outwardly, so that the smooth inside or back surface of the belts 670 contact the end rollers 674 and idler rollers 676. While for illustration purposes, the teeth 672 are shown only at sections of the belts 670, the belts 670 actually have continuous teeth 672 all around. In addition, for illustration purposes, the rollers and belt in the foreground of FIG. 31 have been omitted from the drawing.

Referring still to FIG. 31, a y-axis drive motor 680 supported on the center wall 616 is linked or engaged to a gear unit 682, which turns drive shafts 684A and 684B (in the side by side parallel y-axis frames 660) at equal speeds, but in opposite directions. The drive shafts 684A and 684B turn drive sprockets 686, which in turn drive the belts 670. The outside toothed surface of the belts 670 wraps around the drive sprockets 686, and around an idler sprockets 688, as shown in dotted line in FIG. 31.

As shown in FIG. 31, an x-axis sensor pair 690, and a y-axis sensor pair 696, is provided at each of the ten pallet stations or locations A–J, delineated by the lateral ribs 666. The x-axis sensor pair includes an infrared transmitter 692 and an infrared detector 694, laterally aligned with each other (on a line perpendicular to the frame plates 662 and 664). Similarly, the y-axis sensor pair 696 includes a y-axis infrared transmitter 698 and a y-axis infrared detector 700, located generally centrally on the lateral ribs 666, and aligned with each other (on a line parallel to the frame plates 662 and 664).

A reflective optical sensor 702 is provided in the side walls 604 and 606, at each of the pallet positions A–J. The sensor pairs 690 and 696 and optical sensor 702 are linked to the controller 85, which monitors and controls operations of the indexer 600.

Referring back to FIG. 30, 8 rectangular pallets 710 are provided in each row R1 and R2 of the indexer 600, so that four of the pallet positions in each row are always occupied by a pallet 710, and one end position adjacent to end wall 608 or 610 is always open. Each pallet 710 has a rectangular pallet cutout or opening 712. Pallet tooth racks 715, shown in dotted line in FIG. 30, are provided on the bottom surface of the pallets 710. The tooth rack 715 extends along both of the longer sides of the pallet 710. The toot rack 715 has teeth matching the size and pitch of the teeth 672 on the belts 70. Consequently, when a pallet 710 is placed on a y-axis frame 660, the teeth on the pallet tooth rack 715 positively engage the teeth 672 on the belts 670, so that the pallet is substantially locked against y-axis movement relative to the belts 670.

Each pallet 710 has a pair of x-axis and y-axis prisms. Specifically, an x-axis transmitter prism 714 is longitudinally aligned with an x-axis detector prism 716, on each pallet 710, as shown in FIG. 30. Similarly, a y-axis transmitter prism 718 is laterally aligned with a y-axis detector prism 720, on each pallet 710. With the pallet 710 in any one of the ten pallet positions A–J in the indexer 600, the x-axis transmitter prism 714 and x-axis detector prism 716 are vertically directly above or aligned with the x-axis infrared transmitter 692 and x-axis infrared detector 694, respectively, in that pallet position. Similarly, the y-axis transmitter prism 718 and y-axis detector prism 720 are vertically directly above and aligned with the y-axis infrared transmitter 698 and the y-axis infrared detector 700, in that pallet position.

Referring to FIG. 31, the idler rollers 676 have roller flanges 678 which protrude vertically above the belts 670. The roller flanges 678 fit into roller grooves 675 (shown in dotted line in FIG. 30) on the bottom surface of each pallet 710. The engagement of the roller flanges 678 into the grooves 675 prevents any x-axis movement of the pallets 710 (unless the pallet 710 is lifted vertically.) Accordingly, the pallets 710 are vertically supported on both the belts 670 and roller flanges 678.

The indexer 600 has an x-axis shift assembly 652 substantially the same as the x-axis shift assembly or shift system 140 shown in FIGS. 9 and 10 and described above, and is therefore not further described or illustrated here. However, rather than the end fork air cylinder 152 used in the x-axis shift system 140, the x-axis shift assembly 652 in the indexer 600 has a pallet lift electric motor 654, for better control of pallet lift movement.

The operation and sequencing of the indexer 600 is similar to that of the indexer 72 described above with reference to FIGS. 8–12. However, pallet movement along the y-axis is achieved via the computer controller 85 controlling the y-axis drive motor 680 to incrementally move, or index, the belts 670. During movement in the y-axis, the pallets 710 remain on the belts 670 and rollers 676. As a result, unlike the indexer 72, in the indexer 600, shown in FIGS. 30 and 31, there is no vertical movement of pallets 710, as the pallets move in the y-axis direction, between pallet stations.

X-axis movement of the pallets 710 at the ends of the indexer 600, is similar to the movement described above for the indexer 72 and is therefore not further described here.

At each pallet position, the optical sensor 72 detects the presence or absence of a pallet 710 via detecting the presence or absence of reflected light. In addition, at each pallet position A–J, the x-axis sensor pair 690 detects the presence or absence of a cassette 88. Specifically, the infrared transmitter 692 projects a light beam vertically upwardly. The light beam passes through the x-axis transmitter prism 714, on each pallet 710, which bends the light beam 90°, so that the light beam is then projected horizontally inwardly towards the x-axis detector prism 716. If a cassette 88 is present on the pallet 710, the light beam will be blocked by the cassette 88, and the x-axis detector 694 will not detect any infrared light, indicating presence of a cassette 88. On the other hand, if the pallet 710 has no cassette 88 on it, infrared light from the transmitter 692 passes through the x-axis transmitter prism 714, passes over the pallet 710, and is redirected downwardly by the x-axis detector prism 716, so that the infrared light is directed to and detected by the x-axis infrared detector 694, indicating the absence of a cassette 88.

The y-axis sensor pair 696 works in a similar way, to detect the presence or absence of wafers in the cassette 88. With a cassette 88 on a pallet 710, infrared light from the y-axis transmitter 698 is projected vertically upwardly, and is turned 90° by the y-axis transmitter prism 718, so that the light projects through a slot or tunnel 725 at the bottom of the cassette 88. If no wafers or other flat media are present in the cassette 88, the light travels entirely through the tunnel 75, is redirected downwardly by the y-axis detector prism 720, and is detected by the y-axis detector 700, indicating absence of any wafers in the cassette 88. If a wafer is in the cassette 88, the bottom edge of the wafer projects downwardly through the tunnel 725, preventing light from passing through the tunnel. Accordingly, the presence of any wafer in the cassette 88 will block the light from the y-axis transmitter 698, so that the y-axis detector 700 detects no light, indicating presence of at least one wafer in the cassette 88.

Operation of the buffer assembly 618 in the indexer 600 is similar to operation of the buffer assembly 76, described above, and shown in FIG. 8. However, locating the buffer assembly 618 at the side of the indexer 600 allows for a more compact design. Use of the belts 670 provides for faster and more reliable pallet movement, in contrast to the indexer 72 shown in FIGS. 8–16. Use of the prisms 714–720 allows for detection of cassettes and wafers, without requiring lifting of the pallets.

Referring now to FIGS. 32–37, in another automated semiconductor processing system embodiment 800, an enclosure 802 of the system 800 preferably has a left side wall 804, right side wall 808, front wall 806, back wall 810, and a top wall 812. For purposes of explanation, the system 800 can be described as having an indexer or work-in-progress (WIP) space or bay 820, and a process space or bay 822, both within the enclosure 802.

The system 800 includes as major subsystems a loader 824, which may be outside of the enclosure 802, and an indexer 826, a docking station 828, a transfer station 830, and a process station 832, all within the enclosure 802. The indexer 826 and docking station 828 may be considered as subsystems within the indexer space 820, while the transfer station 830 and process station 832 may be considered as subsystems within the process space 822.

Referring still to FIGS. 32–37, the loader 824 is preferably positioned at the front wall 806, in alignment with the indexer 826. However, alternatively, a loader 825, shown in dotted line in FIG. 32, may be positioned at the left side wall 804, in place of the loader 824.

The loader 824 (or 825) has a load or first elevator 838 and an unload or second elevator 840. The elevators 838 and 840 are adapted to receive a closed or sealed pod 815 containing wafers 818, or other similar flat substrate media. The pod may be of various designs, available as a standard product from various manufacturers, as is well-known in the art. The pod 815 may also be referred to as a FOUP or box. A pod door 816 closes off or seals the open front end of the pod 815. The pods 815 are used to store and transport wafers 818, during semiconductor device manufacture, while keeping the wafers 818 free of contamination from particles, dust, etc.

Figure 34:
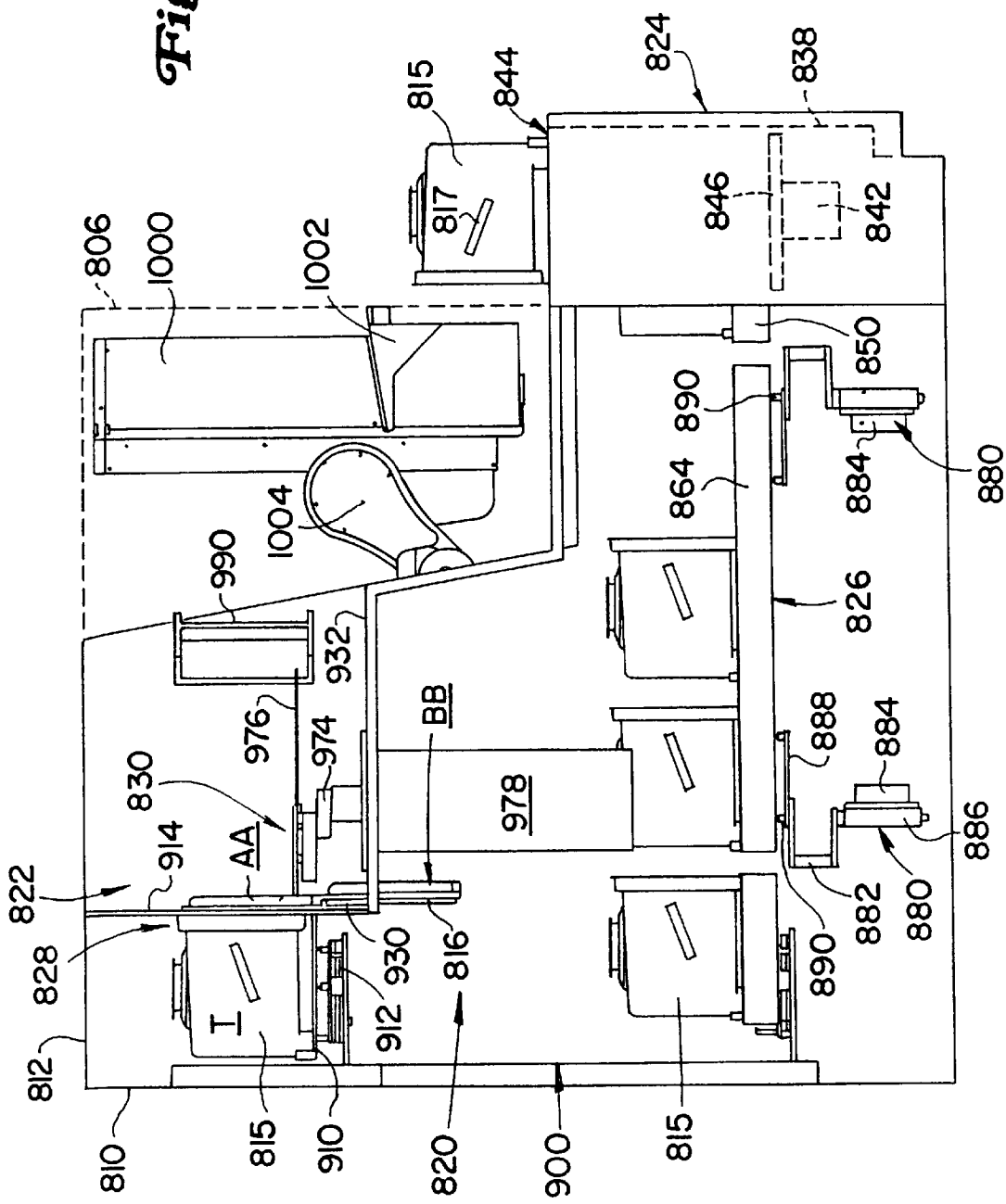
FIG. 34 is a left side elevation view thereof.

The elevators 838 and 840 in the loader 824 move a pod 815 from a load or up position 844, to an indexer or down position 846, as shown in FIG. 34.

Figure 39:
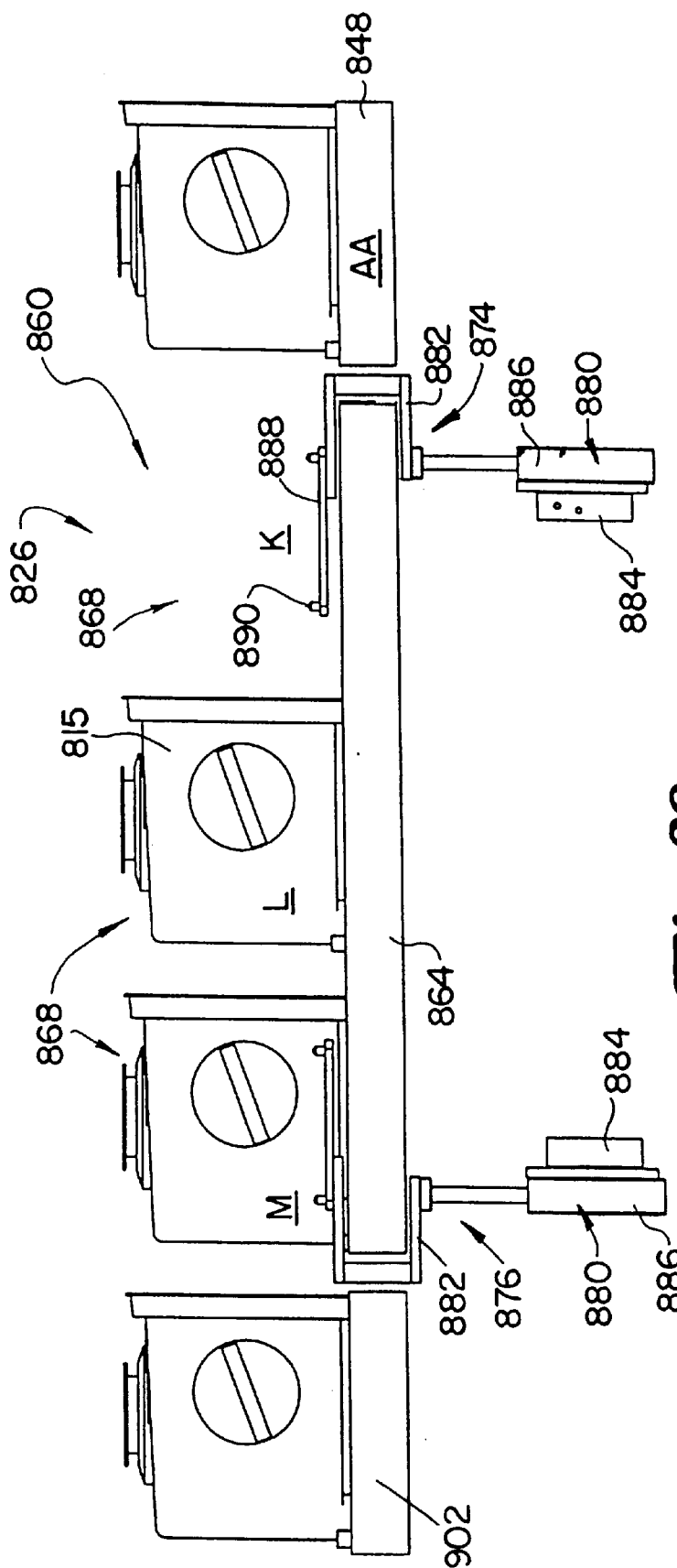
FIG. 39 is a side view thereof.
Figure 40:
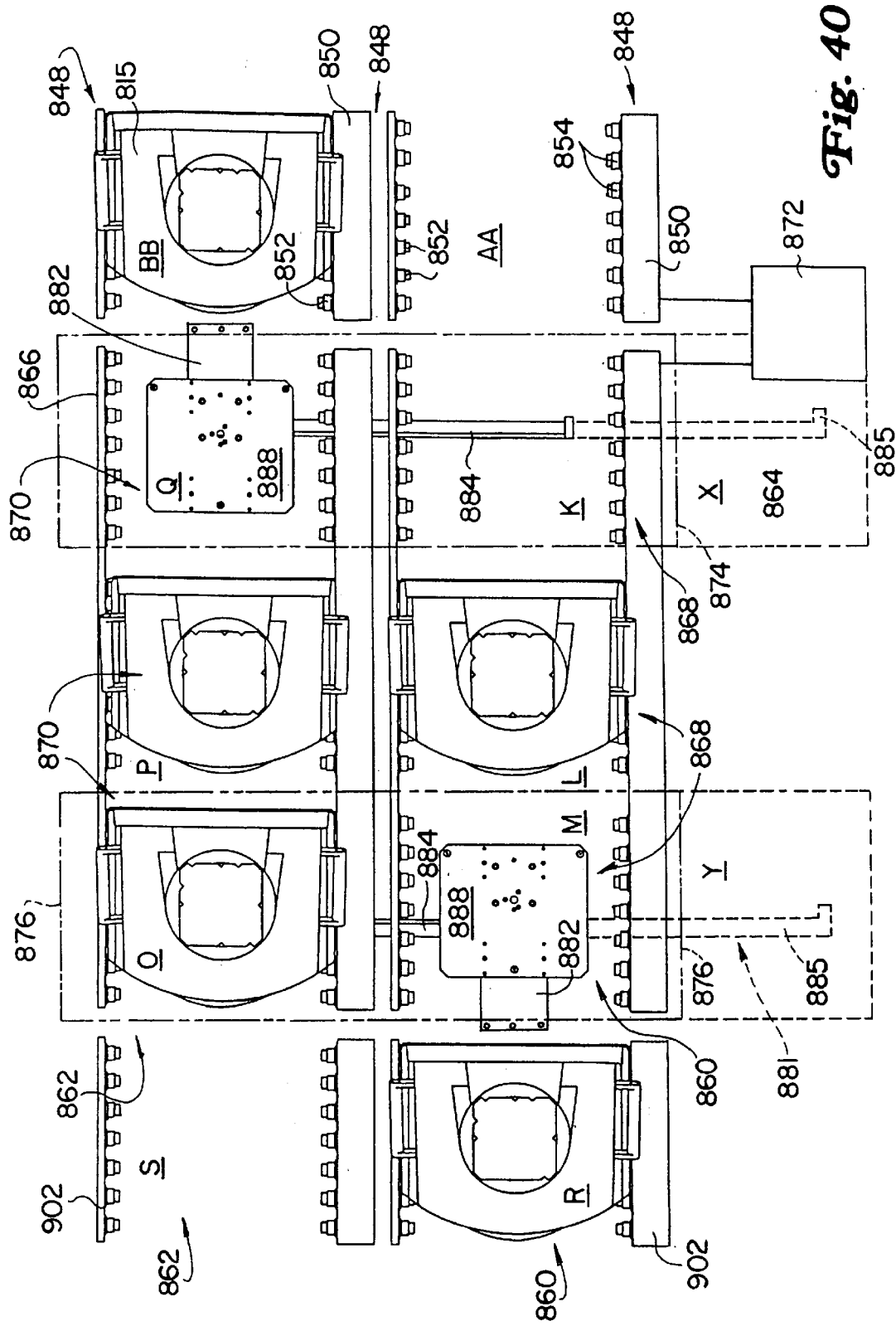
FIG. 40 is a plan view thereof.

Referring momentarily to FIGS. 39 and 40, a loader conveyer 848 is associated with each elevator 838 and 840 within the loader 824. Each loader conveyor 848 has left and right side conveyor sections 850. The conveyor sections 850 include drive rollers 852 and idler rollers 854, which support the bottom outside edges of the pod 815. One or more motors within the conveyor sections 850 are linked to the driver rollers 852. The number of drive rollers 852 within each conveyor section 850 may vary, with each conveyor section 850 having at least one drive roller 850, and optionally having all driver rollers 852 and no idler rollers 854. The spacing of the drive rollers 852 may also vary, although preferably one or more drive rollers 852 are provided near the back end of the conveyor section 850 (i.e., the end of the conveyor section 850 closest to the back wall 810). Preferably, only one of the left or right conveyor sections 850 has drive rollers 852, with the other section having all idler rollers 854, although the locations of the drive and idler rollers may be varied. The one or more motors within the conveyor section 850 driving the drive roller or rollers 852 (if any are present in the conveyor section 850) are linked to and controlled by a computer controller 872, which is also linked to and controlling various other functions of the system 800.

In the embodiment 800 shown in the Figures, the pods 815 are placed onto and removed from the load elevator 838 by hand. The pods 815 have handles 817 ergonomically positioned to better facilitate carrying the pod 815. Consequently, the pods 815 are preferably placed and removed from the elevators 838 and 840 of the loader 824 with the pod door 816 facing the back wall 810. To position the pod 815 so that the wafers 818 within the pod 815 may be accessed within the system 800, the loader 824 includes a pod rotator 842. The pod rotator 842 operates to rotate a pod on the load elevator 838 by 180°, so that the pod door 816 is reoriented towards the front of-the system 800. This reorientation by the pod rotator 842 preferably occurs with the pod 815 in the down position 846.

Figure 38:
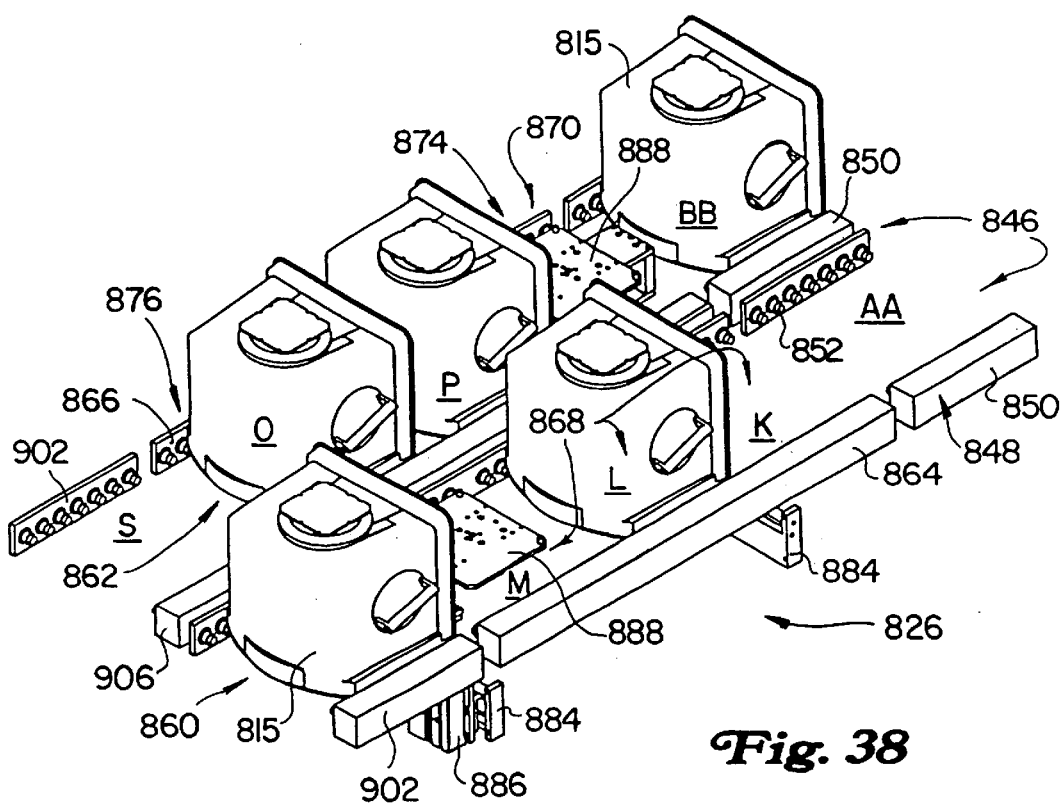
FIG. 38 is a perspective view of the indexer shown in FIGS. 33 and 34.

Referring now to FIGS. 38, 39 and 40, the indexer 826 has a load or first row 860 including three pod (typically input) positions 868, labeled as K, L and M. Similarly, the indexer 826 includes an unload or second row 862 having three pod (typically output) positions 870, labeled as O, P and Q. An input or first row conveyor 864 extends under the three pod input positions 868, and a pod output or second row conveyor 866 extends under the three pod output positions 870. The input conveyor 864 and the output conveyor 866 are similar in design to the loader conveyors 848 described above, but are longer. Alternatively, the input conveyor 864 and output conveyor 866 may be made up of three shorter individual segments, of the same design as the loader conveyors 848.

The input conveyor 864 is aligned with the loader conveyor 848 associated with the load elevator 838 in the loader 824. Similarly, the output conveyor 866 is aligned with the conveyor 848 associated with the unload elevator 840 in the loader 824. This alignment (in the vertical and lateral directions) allows pods 815 to be moved between the conveyors 848 in the loader 824, and the conveyors 864 and 866 in the indexer 826. The lateral direction is the direction extending between the left side wall 804 and right side wall 808 of the enclosure 802, in a direction perpendicular to those walls.

The input conveyor 864 and output conveyor 866 have drive rollers 852 and idler rollers 854, and one or more motors for driving the drive rollers 852, as described above in connection with the loader conveyors 848 in the loader 824. The controller 872 is also linked to and controls the conveyors 864 and 866.

The indexer 826 has a front shuttle column 874 encompassing pod positions Q and K. The indexer 826 also has a rear shuttle column 876, encompassing pod positions O and M. Referring still to FIGS. 38, 39 and 40, a shuttle device or robot 880 is positioned within each of the shuttle columns 874 and 876, underneath the pod positions and conveyors 864 and 866. As best shown in FIG. 39, each shuttle device 880 includes a lifter 886 displaceable along a lateral rail 884. An armature 882 supported on the lifter 886 has a pod plate 888 including locating pins 890. The pins 890 are adapted to engage into openings on the bottom surface of a pod 815, to allow the shuttle device 880 to positively engage, lift, and transfer a pod 815 between the rows 860 and 862 of the indexer 826. As shown in FIG. 39, the armature 882 extends up from the lifter 886, around the ends of the conveyors 862 and 864.

Figure 32:
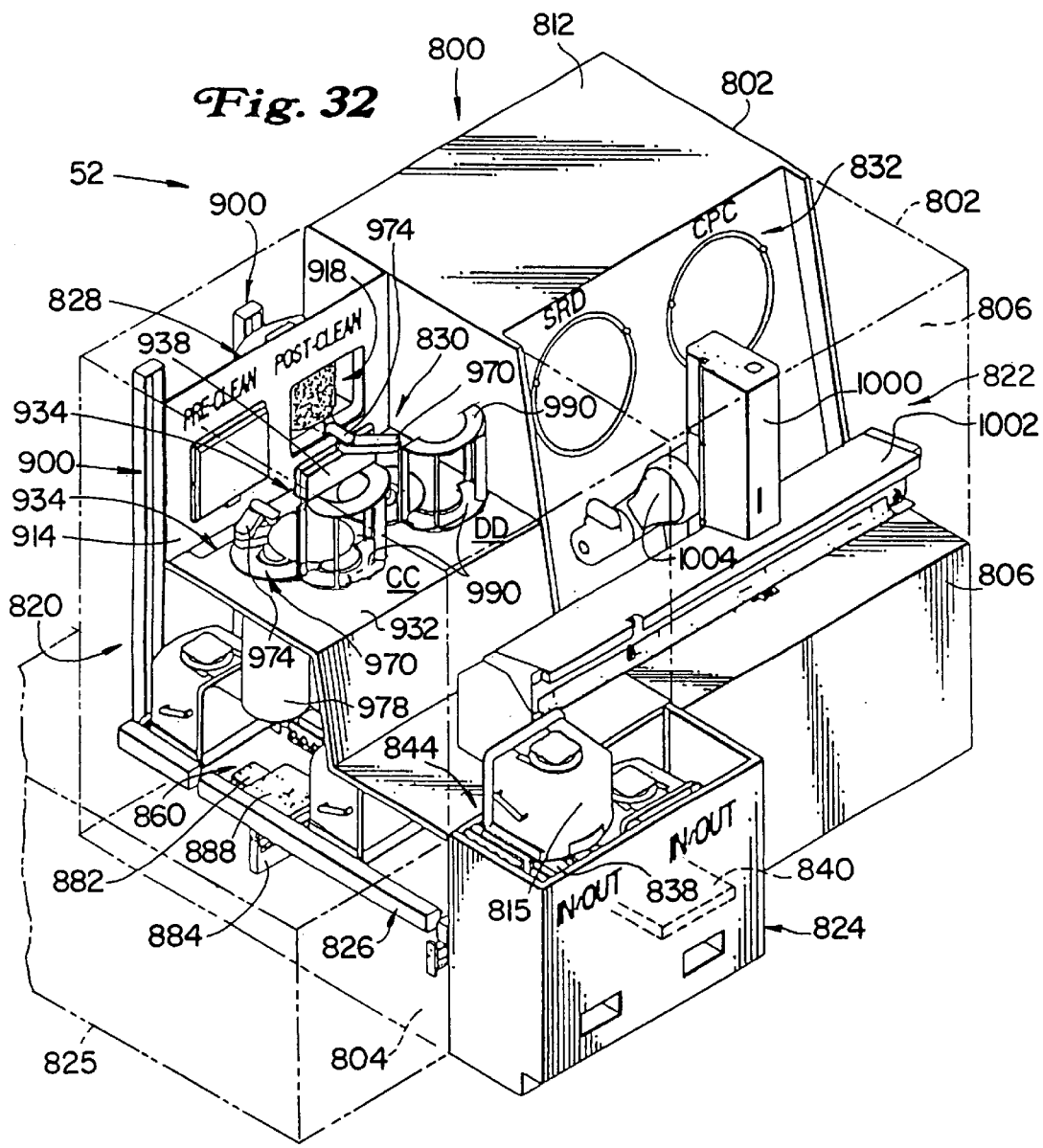
FIG. 32 is a perspective view of another processing system embodiment, with surfaces or walls removed for clarity of illustration.

Referring momentarily to FIGS. 32 and 40, if the alternative side loader 825 is used, an alternative shuttle device 881 is provided, so that pods 815 can be moved laterally from the side loader 825, through openings in the left side wall 804 and into the indexer 826. The alternative shuttle device 881 has extended lateral rails 885, allowing the shuttle devices 880 to shuttle, or laterally transfer pods 815, between three pod positions, Q, K and X in the front shuttle column and O, M and Y, in the rear shuttle column.

Referring once again to FIGS. 38, 39 and 40, docking elevator conveyors 902 are aligned with the rows 860 and 862 of the indexer 826, preferably between the indexer 826 and the back wall 810. The conveyors 902 are similar to the conveyors 848 described above.

Figure 33:
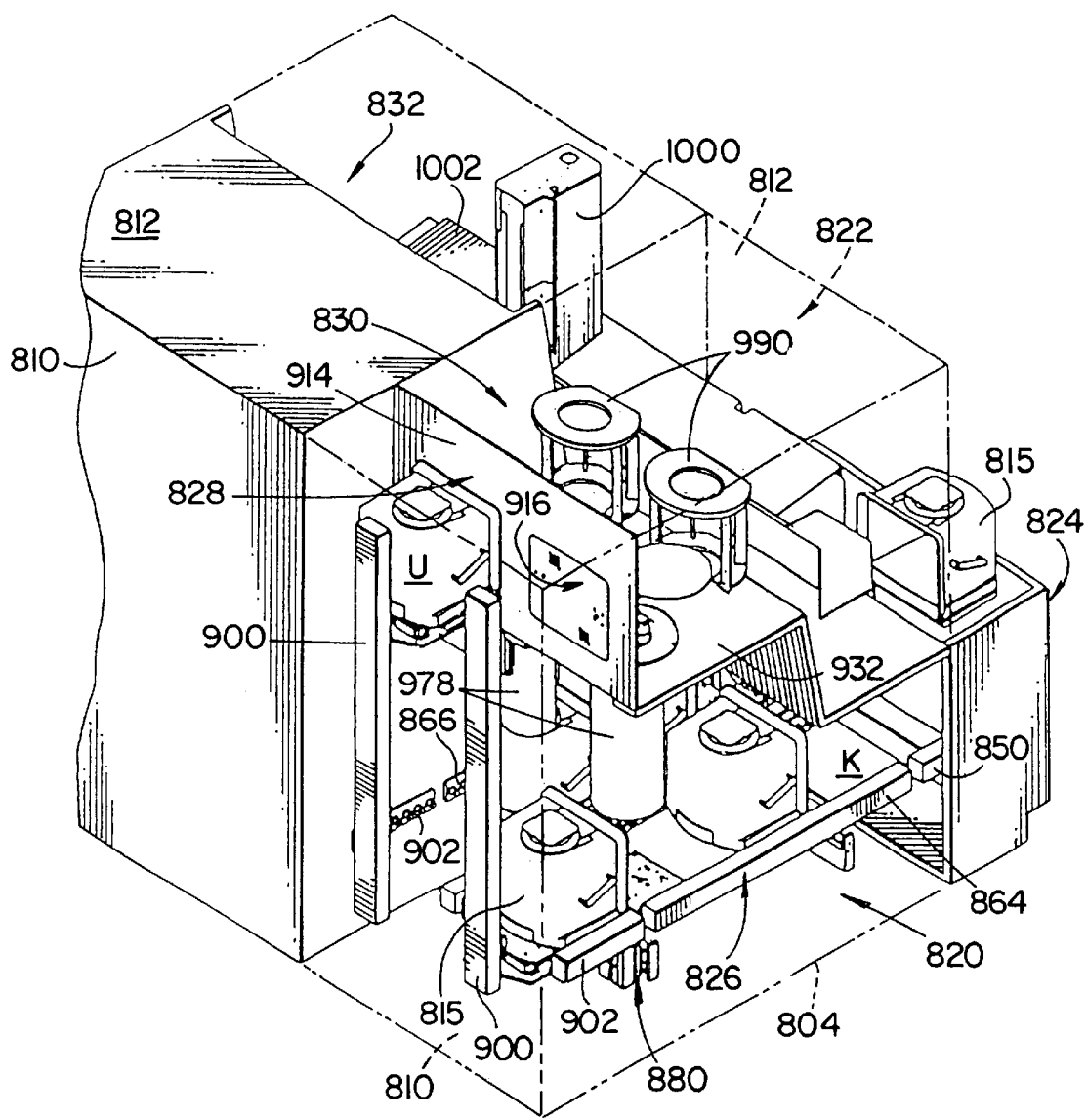
FIG. 33 is a top, back and left side perspective view thereof.

Referring to FIGS. 32, 33, and 34, a docking station elevator 900 extends vertically from each of the docking elevator conveyors 902 to a docking station 828 positioned vertically above the indexer 826. Each elevator 900 has an engager plate 910, similar to the pod plate 888, for engaging a bottom surface of a pod 815, to lift the pod off of the conveyor 902. The engager plate 910 is vertically movable along the elevator 900 from pod positions R and S to pod positions T and U, respectively as shown in FIGS. 33 and 34. The elevators 900 lift and lower the engager plate 910 via an electrically powered ball screw or equivalent actuators.

Referring to FIG. 34, the engager plate 910 is positioned on an engager actuator 912 which moves the engager plate 910 longitudinally, i.e., in a direction from the front wall 806 to the back wall 810, and perpendicular to those walls.

A docking wall 914 at the docking station 828 and a deck 932 separate the indexer space 820 from the process space 822. The docking wall 914 has openings 916 and 918 aligned with the pod positions T and U. Hence, a pod door 816 of a pod 815 on an engager plate 910 lifted to a pod position T or U by a docking elevator 900, aligns laterally and vertically (but initially not longitudinally) with an opening 916 or 918 in the docking wall 914. After the pod 815 is vertically aligned with an opening 914 or 916, the engager actuator 912 moves the pod forward, so that the front face of the pod contacts the docking wall 914. During other movement of the pod 815 on the elevator 900, the engager actuator 912 is retracted, so that the pod is spaced apart from the docking wall 914 and can be moved vertically without interference with the docking wall 914, or other components.

Referring still to FIG. 34, a pod door remover 930 is provided at each of the openings 914 and 916 in the docking wall 914, to remove the pod door 816 from a docked pod 815. The pod door remover 930 removes the pod door 816 and lowers it down through a pod door slot 934 in the deck 932. This unseals the pod 815 and moves the pod door 816 out of the way, so that wafers 818 within the pod 815 can be accessed. The design and operation of the pod door remover 930 is set forth in U.S. Pat. No. 6,447,232, incorporated herein by reference. In FIG. 34, the pod door remover 930 is shown in the up or closed position (to engage and remove, or replace, a pod door 816) at position AA, and is shown in the down or open position, holding a pod door away from the opening 914 or 916, at position BB.

The docking station 828 and transfer station 830 may be characterized as forming two side-by-side parallel rows CC and DD, for purposes of explanation, with the components and operations of the rows being the same. Referring once again to FIGS. 32–37, in rows CC and DD, transfer robots 970 in the transfer station 830 are positioned to reach into docked pods 815, engage wafers 818 in the pods, and transfer the wafers 818 into carriers 990. Each of the transfer robots 970 has an articulated arm 974, and an end effector 976 on the end of the arm 974, with the end effector 976 adapted to engage a single wafer 818. An arm driver 978 is connected to the articulated arm 974, and has one or more motors for driving the arm segments, as controlled by the controller 872.

A reader/scanner 980 is provided in the transfer station 830, to identify individual wafers 818 as they are moved from a pod 815 into a carrier 990.

If desired, a prealigner 981 may be located in the transfer station at a location accessible by a transfer robot 970 so that individual wafers may be appropriately oriented after removal from a pod 815 and before insertion into a carrier 990.

A process robot 1000 moves laterally on a rail 1002, between the transfer station 830, a first process chamber 1030 (such as a spray acid chamber, or a spray solvent chamber) and a second process chamber 1020 (such as a spin rinser dryer). Each process chamber 1020 and 1030 has a rotor 1040 adapted to receive a carrier 990 holding wafers 818. The system 800 is preferably configured and dimensioned for processing 300 mm diameter wafers 818. Other types and numbers of process stations may be substituted or added. Additional description of operation of the process robot is found in U.S. Pat. No. 5,664,337, incorporated herein by reference.

Figure 41:
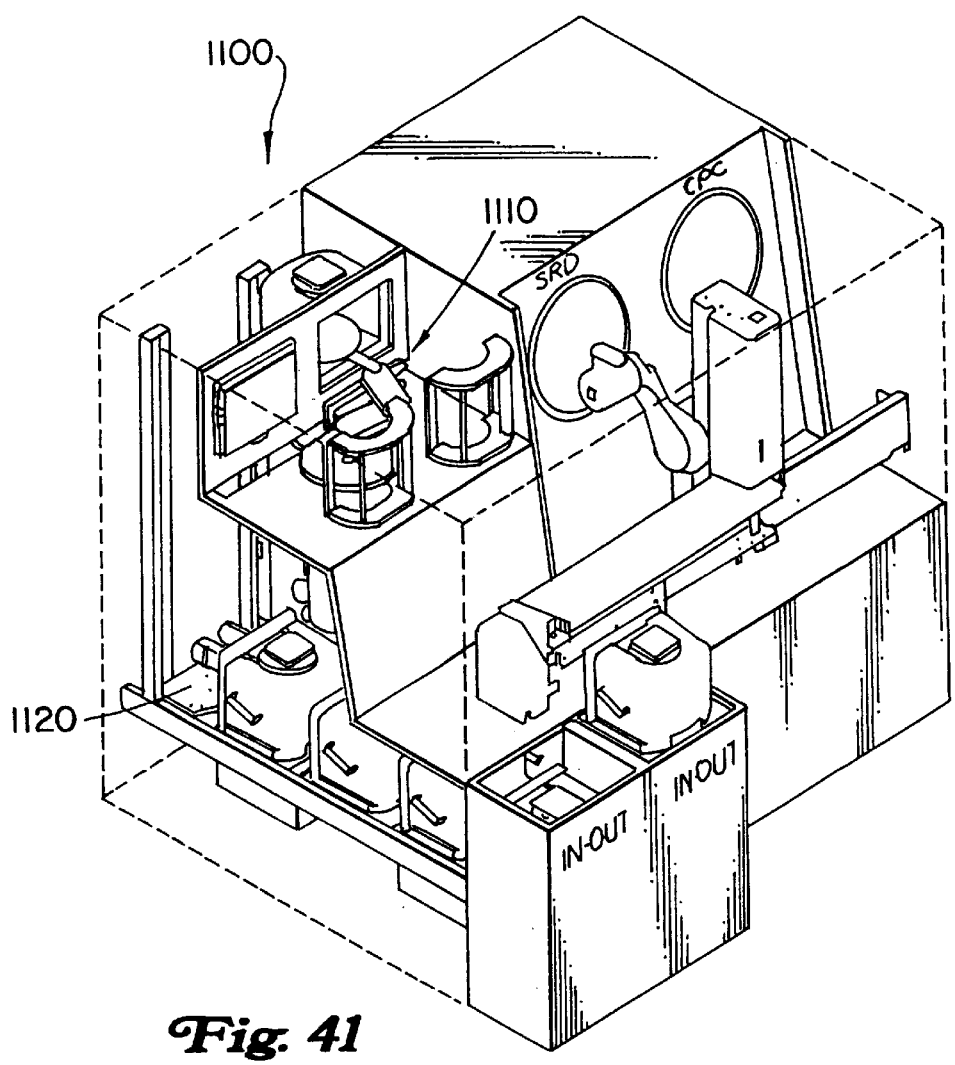
FIG. 41 is a perspective view of another processing system embodiment.
Figure 42:
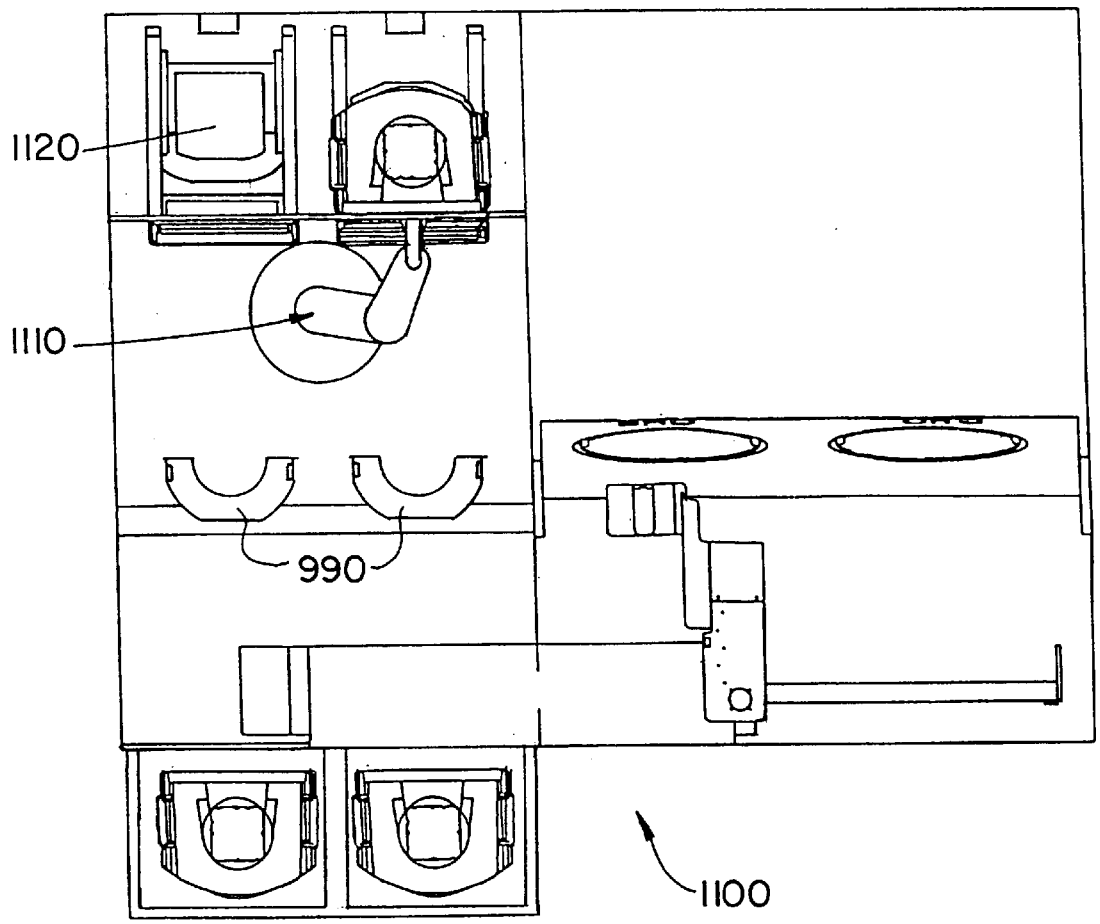
FIG. 42 is a plan view of the system shown in FIG. 41.

As shown in FIGS. 41 and 42, in an alternative embodiment 1100, a single transfer robot 1110 is provided, instead of the two transfer robots 970 shown in FIGS. 32–37. In addition, the pod rotator 1120 is provided on the elevator conveyors 902 at pod positions R and S, rather than in the loader 824.

Referring to FIGS. 37 and 43–48, and end effector 1005 attached to the articulated arm 1004 of the process robot 1000 is adopted to engage the carriers 990. The end effector 1005 has a pair of spaced apart blade-like fingers 1006 which engage slots in the sides of the carriers 990. Hence, the process robot 1000 can engage, lift, maneuver, and place the carriers 990 holding the wafers 818.

Figure 35:
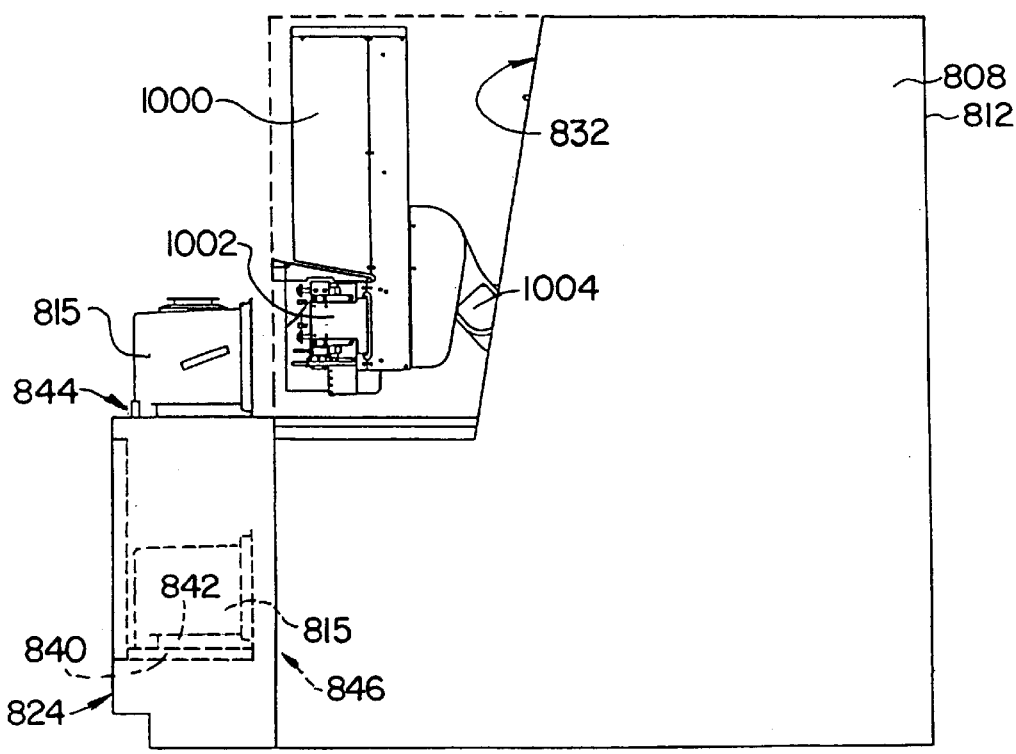
FIG. 35 is a right side elevation view thereof.

In use, with reference to FIGS. 32 and 33, an operator carries or transfers a pod 815 to the loader 824, preferably by holding the handles 817. An automated or robotic pod delivery system may also be used to deliver a pod 815 to the loader 824. The pod 815 is placed onto the load elevator 838. The controller 872 is preferably pre-programmed with a specific wafer processing and handling sequence. The elevator 838 lowers the pod from the up or load position 844 to the down or indexer position 846, as shown in FIG. 35.

The wafers 818 are enclosed, and generally sealed within the pod 815, to protect the wafers 818 from contamination and damage during handling and movement. The pod door 816 closes or seals off the open front end of the pod 815, as is well known.

With the pod 815 at pod position AA (in the down or indexer position 846) as shown in FIG. 40, the conveyor section 850 supporting the pod 815 is actuated. The drive rollers 852 drive the pod 815 rearwardly, while the idler rollers 854 help to support the pod 815, thereby moving the pod 815 from the conveyor section 850 to pod position K in the indexer 826. The drive rollers 852 at position K in the indexer 826 are also actuated to help complete this movement. The conveyor sections 850 are at the same vertical level as the indexer conveyors 864 and 866, as well as the docking elevator conveyors 902.

In most applications, multiple pods 815 will be loaded into the indexer 826 and system 800, although the system may also operate with just a single pod 815. In a typical operating sequence, additional pods 815 are loaded into the indexer 826, as described above. As each subsequent pod 815 is loaded, the drive rollers 852 in the conveyor 864 in the load row 860 of the indexer 826 are actuated. Thus, the pod 816 at pod position K is moved by the conveyor 864 to position L, while the pod at position AA moves into position K. The pod in position L then moves to position M, followed by subsequent pods, and then into position R. The movement of the pod 815 from position M to position R, onto the docking elevator conveyor 902 is performed in the same way as the movement of the pod 815 from position AA to position K, i.e., the drive rollers 852 in the conveyor 864 are actuated in coordination with the drive rollers 852 in the docking elevator conveyor 902.

The elevator 902 then lifts the pod 815 off of the conveyor 902 and raises the pod vertically up to the docking station 828. Specifically, the engager plate 910 on the elevator 900 engaging corresponding blind holes in the bottom of the pod 815.

Once the pod 815 is raised to the level of the docking station 828, the engager actuator 912 moves the pod 815 forward, so that the front surface of the pod contacts the docking wall 914, to dock the pod. The pod door remover 930 engages the pod door 816 through the opening 916 in the docking wall 914. Suction cups on the pod door remover 930 hold the pod door 816 onto the pod door remover 930, while keys extend into the pod door 816 and rotate, to unlock or release the latching mechanism which holds the pod door 816 onto the pod 815. The pod door remover 930 then moves forward, carrying the pod door 816 with it through the opening 916. The pod door remover 930, carrying the pod door 816 then moves down through the door slot 934. The front of the pod 815 is then opened to the process space 822.

The transfer robot 970 in the transfer station 830 moves so that the end effector 976 on the articulated arm 974 moves through the opening 916 to engage a wafer 818 within the pod 815. The robot 970 withdraws the wafer 818 from the pod 815 and places the wafer into the carrier 990, as shown in FIG. 33. The robot 970 optionally passes the wafer 818 over a reader/scanner 980, to allow the controller 872 to identify that wafer, e.g., via a bar code on the bottom surface of the wafer.

Figure 36:
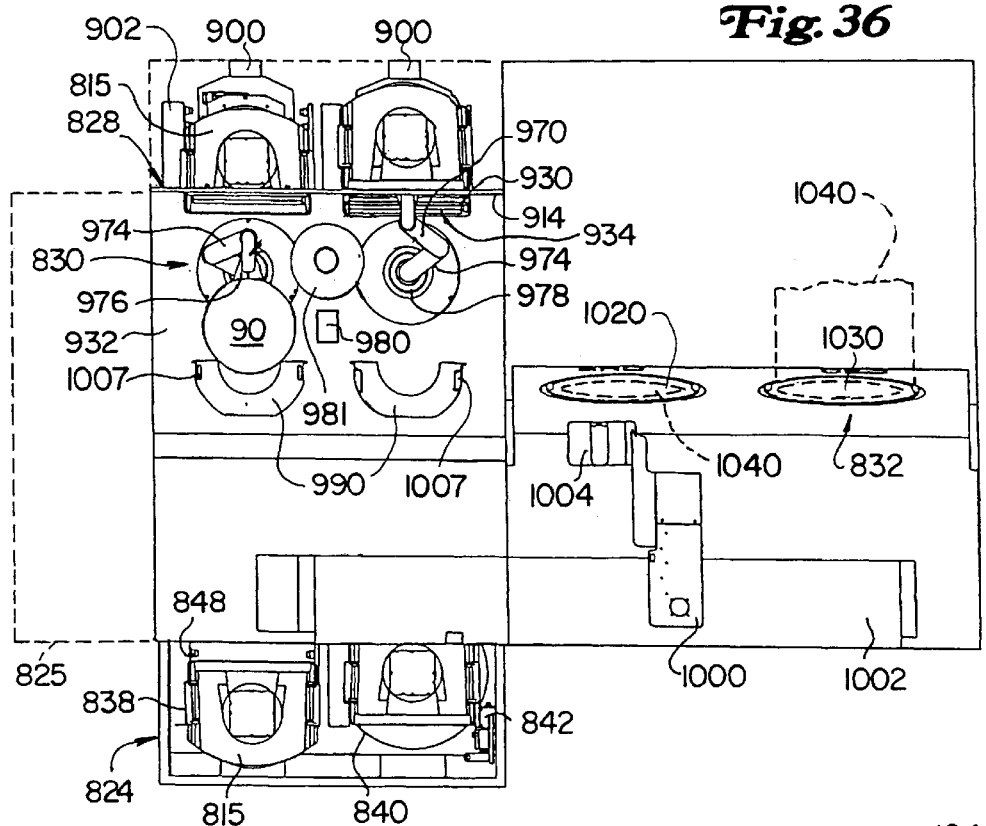
FIG. 36 is a plan view thereof.
Figure 37:
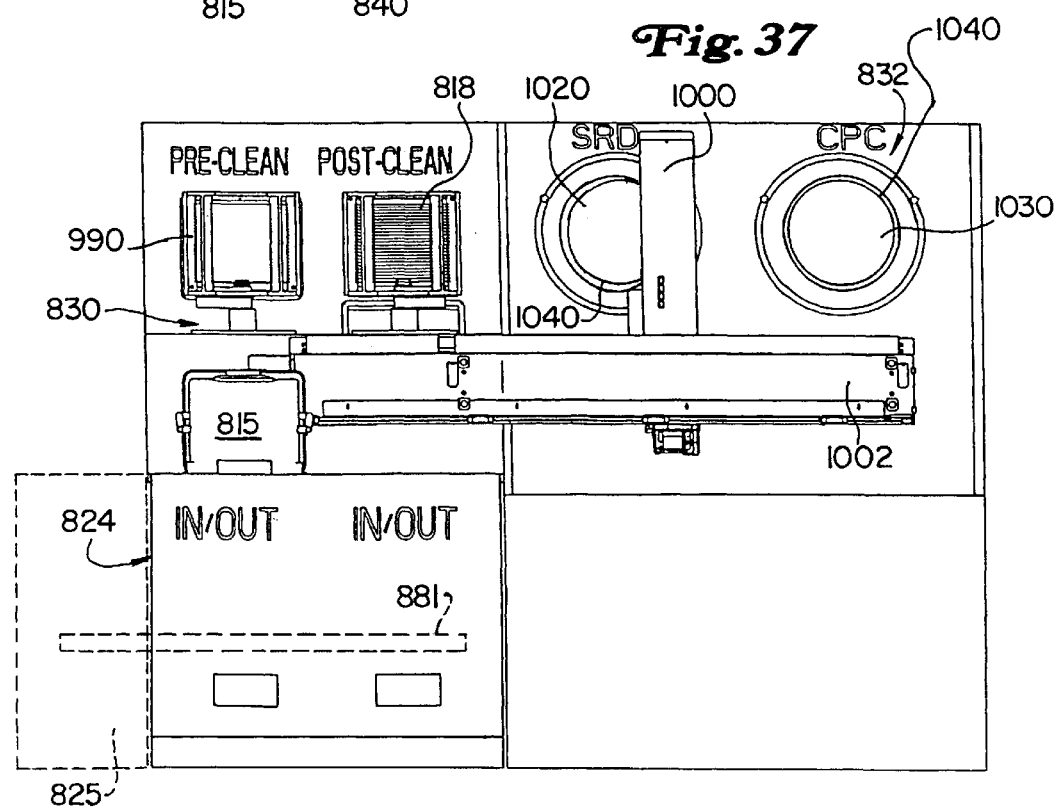
FIG. 37 is a front view thereof.

Referring to FIG. 36, preferably, the transfer robot 970 transfers wafers between the pod 815 in row CC and the carrier 990 in row CC which is aligned with that pod, in the longitudinal direction. While cross-over wafer transfer movement between rows CC and DD may optionally be carried out, such that a wafer is transferred to a carrier 990 diagonally opposed from the pod, straight or parallel wafer movement within each row CC and DD is preferred.

The transfer robot 970 continues transferring wafers from the docked pod 815 to the carrier 990, preferably until all wafers have been transferred from the pod 815. The pod 815 and carrier 990 typically hold 25 wafers.

Figure 44:
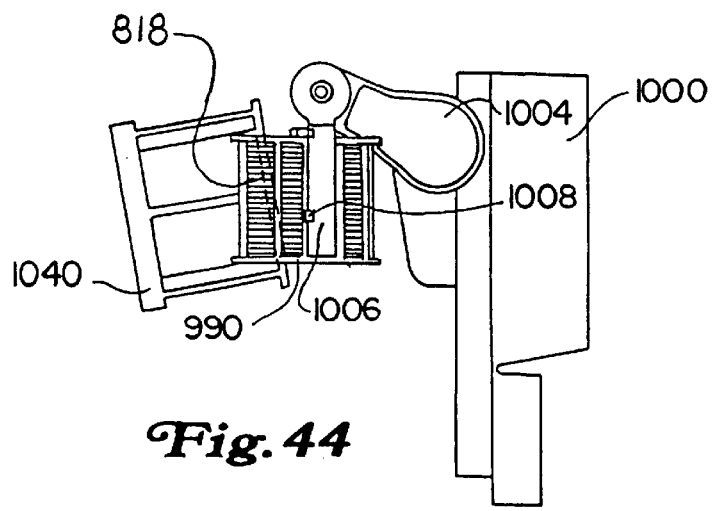
FIG. 44 is a side view thereof.
Figure 45:
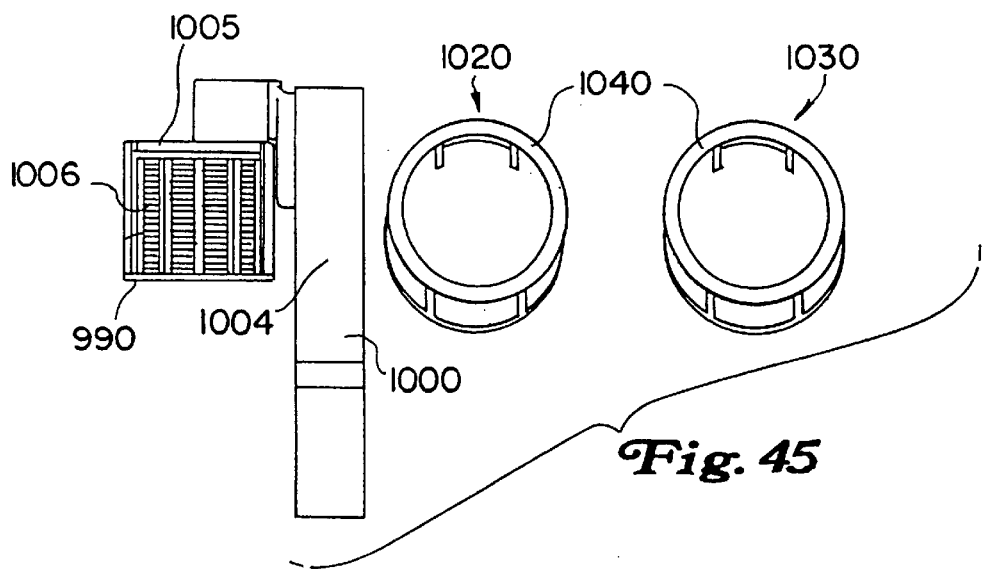
FIG. 45 is a front view thereof.
Figure 43:
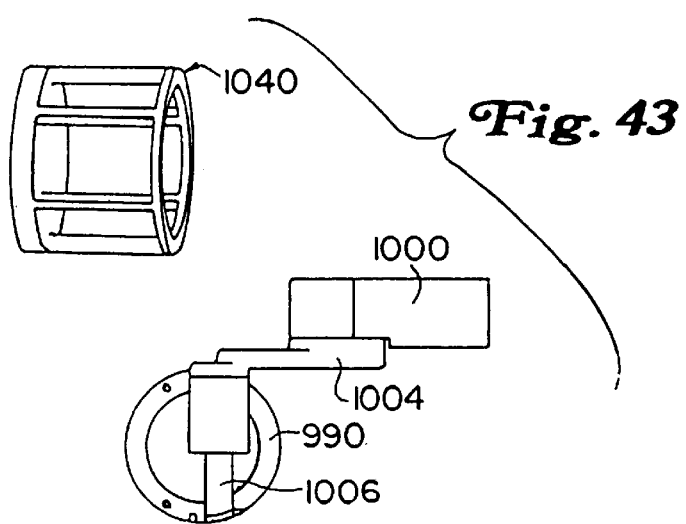
FIG. 43 is a plan view of the robot, rotor and carrier shown in FIG. 36, with the robot engaging the carrier at the transfer station shown in FIG. 36.

With the carrier 990 now loaded with wafers 818, the process robot 1000 moves to engage the loaded carrier 990. Referring momentarily to FIGS. 43, 44 and 45, the robot 1000 moves laterally on the rail 1002 so that the robot arm 1004 is adjacent to the carrier 990. With the arm at an elevated position, the fingers 1006 of the end effector 1005 are pointed down and are aligned with the finger slots 1007 in the carriers 990. This alignment is performed by moving the robot to the proper position on the rail 1002, and with proper control of the segments of the arm 1004.

The arm 1004 then moves vertically down, with the fingers 1006 engaging into the slots 1007 of the carrier 990. FIGS. 43, 44 and 45 show the relative position of the arm 1000, carrier 990, and rotors 1040, for purposes of explanation. A locking pin 1008, or other attachment device, is actuated, to positively secure the carrier 990 onto the end effector 1005. The robot arm 1004 then lifts the carrier 990 off of the deck 932, pivots the carrier 990 clockwise (in FIG. 44), moves the carrier 990 forward (towards the front wall 806) and then moves the carrier 990 laterally along the rail 1002, to a position in alignment with the rotor 1040 in one of the process chambers 1020 or 1030.

Figure 48:
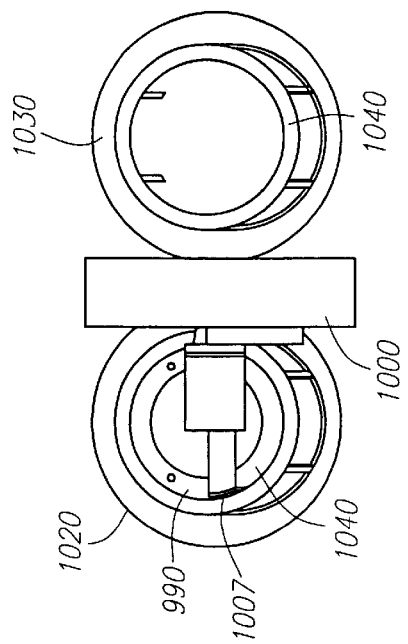
FIG. 48 is a front view thereof.
Figure 46:
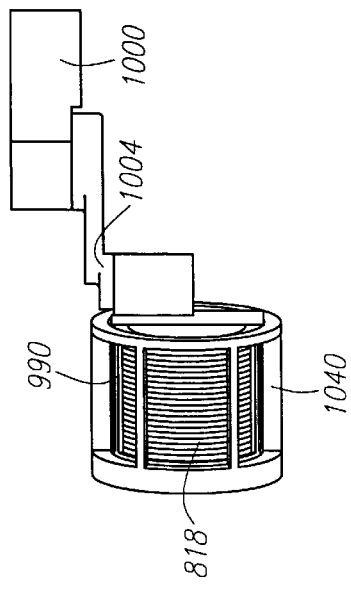
FIG. 46 is a top view of the robot, carrier and rotor shown in FIGS. 43–45, with the carrier placed within the rotor.
Figure 47:
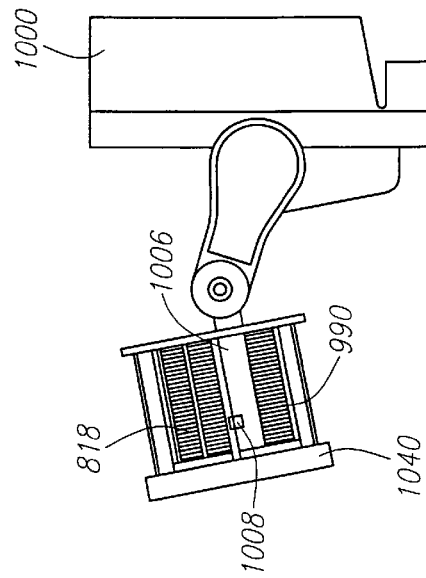
FIG. 47 is a side view thereof.

The rotors 1040 are typically positioned on an inclined angle of about 10°. Referring to FIGS. 46, 47 and 48, after the door of the process chamber 1020 or 1030 is open, the robot 1000 moves the carrier 990 into engagement with the rotor 1040. The securing device 1008 is released or withdrawn, the arm 1004 is pulled back out of the chamber 1020 or 1030, the chamber door is closed, and the wafers 818 are processed using known techniques.

After processing is complete, the robot 1000 retrieves the carrier 990 from e.g., the process chamber 1030, and installs it into a subsequent process chamber, such as process chamber 1020. In the interim, the robot 1000 may move back to the transfer station 830 and pick up another carrier 990 and place it into a process chamber for processing. When processing is complete, the robot 1000 removes the carrier 990 from the last process chamber to be used, e.g., a spin rinser dryer process chamber, such as chamber 1020, and then replaces the carrier 990 into the transfer station 830, typically in row DD. The transfer robot 970 in row DD then transfers the wafers 818 from the carrier 990 back into a docked pod 815, in row DD.

While two process chambers 1020 and 1030 are shown, the system 800 may operate with 1, 2, 3, or more process chambers.

After the loading of processed wafers into the pod 815 in row DD is complete, the pod door remover 930 replaces the pod door 816 onto the pod 815. The engager actuator 912 moves the pod back, to undock the pod from the docking wall 914. The elevator 900 then lowers the pod to position S, where the pod is supported on the docking elevator conveyor 902. The pod now holding processed wafers is then moved forward on the conveyor 866, through positions O, P and Q, and then into position BB on the unload elevator 840 of the loader 824. The pod is then rotated by the pod rotator 842 and lifted by the elevator 840 to the output position shown in FIG. 35. The operator then lifts the pod 815 off of the unload elevator 840 and carries the pod to the next station. Alternatively, the pod 815 may be removed from the unload elevator 840 by a robot or other automation.

In typical operation of the system 800, pods 815 cycle through the indexer 826, docking station 828, transfer station 830, and process station 832, in a step by step cycle, with the pods always moving forward through the cycle. However, for certain applications, the system 800 may be operated in other ways.

Referring to FIG. 40, the indexer 826 has three pod positions (M, L and K) in the first or load row 860, and three pod positions (O, P and Q) in the unload or second row 862. In addition, the loader 824 has one pod position (AA) in the load row 860, and one pod position (BB) in the unload row 862. Similarly, the elevators 900 have one pod position (R) in row 860, and one pod position (S) in row 862. The conveyors shown in FIG. 40 (850, 864, 866 and 902) can operate in either direction, to move pods longitudinally forward or backward within their rows 860 or 862. The shuffle devices 880 allow for lateral movement of pods between the rows 860 and 862. With any one of the 10 pod positions shown in FIG. 40 empty, the indexer 826 can provide random pod access, i.e., a pod can be moved from any position, to any other position.

The shuttle device operates by moving the pod plate 888 into alignment underneath the pod to be laterally transferred between rows. The lifter 886 is then actuated to lift the pod plate 888, with the pins 890 on the plate 888 engaging blind holes in the bottom of the pod 815. With the pod lifted off of the conveyor 864 or 866, the armature 882 is moved along the lateral rail 884, to place the pod in the other row. The lifter 886 then moves the pod down, so that the pod is once again supported on a conveyor. Consequently, by moving pods laterally and longitudinally, any pod can be moved into any position. For example, if it is necessary or desirable to replace processed wafers into the same pod that they came out of, after the wafers are extracted from that pod in row CC of the docking station 828 and transfer station 830, the pod can be lowered back down to position R, then moved to position M (by running the conveyors 902 and drive rollers 852 at position M in reverse), transferring the pod from position M to position O, via the shuttle device 880, moving the pod from position O to position S via the conveyors, and then lifting the pod from position S and docking the pod in row DD. Thus, while in many operations, the row 860 may be a "input" or "load" row, and row 862 may be an "output" or "unload" row, in other applications, either row may be an input or output row, at any given time. Similarly, the transfer and docking stations may be run in a forward direction only, with all wafers moving in for processing in row CC, and all processed wafers moving out in row DD. Alternatively, the transfer and docking stations may be run in bi-directional mode as well, with e.g., all wafers moved in for processing in row CC also moving back out in row CC, and with the same operation of row DD.

To reduce contamination, clean air is made to flow downwardly, from top to bottom through the system 800. The deck 932 preferably has openings in it to allow air to flow downwardly. Alternatively, the deck 932 may be removed entirely, with air flow used to reduce contamination, rather than separation of spaces by a deck or wall. In an embodiment having no deck 932, the indexer space and process space are combined into a single system space. The docking wall 914 then serves as a surface for docking pods, rather than as a barrier to contamination.

By locating the indexer 826 largely underneath the docking station 828 and transfer station 830, a compact design requiring less floor space, is achieved.

The controller 872 is preferably electrically connected to the various robots, motors, sensors, and actuators involved in performing the functions of the system 800, so that the various components can be controlled in coordination and system performance controlled and monitored.

Thus, a novel automated semiconductor processing system has been shown and described. Various changes can of course be made without departing from the sprit and scope of the invention. The invention, therefore, should not be limited, except by the following claims and their equivalents.

What is claimed is:

1. A method for processing one or more wafers contained within a closed container, comprising the steps of:
    opening the container;
    removing the wafers from the container;
    transferring the wafers into a carrier, while maintaining the wafers in a substantially horizontal orientation;
    pivoting the carrier so that the wafers are moved into a non-horizontal orientation;
    moving the carrier to a processor;
    placing the carrier into the processor;
    rotating the carrier within the processor: and
    spraying a process liquid onto the wafers in the rotating carrier.

2. The method of claim 1 further comprising the step of unsealing the container by removing a door of the container.

3. The method of claim 2 further comprising the step of lifting the container from a first level up to a second level, before unsealing the container.

4. The method of claim 3 further comprising the step of docking the container at a docking station.

5. The method of claim 1 further comprising the step of engaging the carrier with a robot arm and moving the carrier on the robot arm.

6. The method of claim 5 further comprising the step of moving the robot arm to engage fingers on the robot arm into the carrier.

7. The method of claim 1 further comprising the step of scanning one or more of the wafers as they are removed from the container and transferred into the carrier.

8. The method of claim 1 further comprising the step of pre-aligning one or more of the wafers after they are removed from the container and before they are transferred into the carrier.

9. The method of claim 1 wherein the wafers are transferred into the carrier by moving the wafers in a first direction, and the carrier is moved to a processor by moving the carrier in a second direction, perpendicular to the first direction.

10. The method of claim 1 further comprising the step of processing the wafers within the processor.

11. A method for handling wafers within a processing system having a front end and a back end, with the wafers provided within a closed container comprising the steps of:
    moving the closed container horizontally through a plurality of container positions, in a first direction, towards the back end of the processing system with the plurality of container positions at a first elevation;
    lifting the closed container vertically to a second elevation;
    moving the closed container in a second direction, opposite to the first direction, and toward the front end of the processing system, to a container opening position at the second elevation;
    opening the container by removing a door of the container;
    removing wafers from the container;
    carrying the wafers in a third direction, perpendicular to the first direction; and
    moving the wafers in the first direction, to place the wafers into a processor within the processing systems;
    rotating the wafers; and
    spraying the wafers with a process liquid.

12. The method of claim 11 further comprising the steps of:
    placing the wafers into a carrier after they are removed from the container; and
    reorienting the carrier to move the wafers from a horizontal position into a non-horizontal position.

13. A method for handling wafers within a processing system, with the wafers provided in horizontal orientation within a closed container, comprising the steps of:
    moving the closed container horizontally through a plurality of container positions, in a first direction, with the plurality of container positions at a first elevation;
    lifting the closed container vertically to a second elevation;
    moving the closed container in a second direction, opposite to the first direction, to a container opening position at the second elevation;
    opening the container by removing a door of the container;

removing wafers from the container;

placing the wafers into a carrier, with wafers remaining in the horizontal orientation;

turning the carrier to reorient the wafers into a non-horizontal orientation;

moving the carrier containing the wafers in a third direction, perpendicular to the first direction;

placing the carrier into a rotor in a processor within the processing systems;

rotating the wafers in the rotor; and spraying the wafers with a process liquid.

14. A method for processing one or more wafers contained within a closed container, comprising the steps of:

docking the container at a docking station;

opening the container;

removing the wafers from the container;

transferring the wafers into a carrier, by moving the wafers in a first direction, while maintaining the wafers in a substantially horizontal orientation;

pivoting the carrier so that the wafers are moved into a non-horizontal orientation;

moving the carrier in a second direction, perpendicular to the first direction, to a processor;

placing the carrier into the processor;

rotating the carrier within the processor; and spraying a process liquid onto the wafers in the rotating carrier.

* * * * *